(12) United States Patent
Williams et al.

(10) Patent No.: US 7,790,979 B2
(45) Date of Patent: Sep. 7, 2010

(54) HETEROATOMIC REGIOREGULAR POLY(3-SUBSTITUTEDTHIOPHENES) FOR PHOTOVOLTAIC CELLS

(75) Inventors: Shawn P. Williams, Pittsburgh, PA (US); Darin W. Laird, Pittsburgh, PA (US); Troy D. Hammond, Pittsburgh, PA (US); Andrew W. Hannah, McMurray, PA (US); Elena E. Sheina, Pittsburgh, PA (US); Shijun Jia, Cheswick, PA (US)

(73) Assignee: Plextronics, Inc., Pittsburgh, PA (US)

( * ) Notice: Subject to any disclaimer, the term of this patent is extended or adjusted under 35 U.S.C. 154(b) by 1203 days.

(21) Appl. No.: 11/234,373

(22) Filed: Sep. 26, 2005

(65) Prior Publication Data

US 2006/0076050 A1 Apr. 13, 2006

Related U.S. Application Data

(60) Provisional application No. 60/612,641, filed on Sep. 24, 2004.

(51) Int. Cl.
*H01L 31/00* (2006.01)
(52) U.S. Cl. ........................................ 136/263
(58) Field of Classification Search .................. 136/263
See application file for complete search history.

(56) References Cited

U.S. PATENT DOCUMENTS

| 4,106,951 | A | 8/1978 | Masi |
|---|---|---|---|
| 4,452,275 | A | 6/1984 | Wellinghoff et al. |
| 4,456,548 | A | 6/1984 | Lewis et al. |
| 4,488,943 | A | 12/1984 | Skotheim |
| 4,711,742 | A | 12/1987 | Jen et al. |
| 4,873,556 | A | 10/1989 | Hyodo et al. |
| 5,132,049 | A | 7/1992 | Garreau et al. |
| 5,171,373 | A | 12/1992 | Hebard et al. |
| 5,331,183 | A | 7/1994 | Sariciftci et al. |
| 5,350,459 | A | 9/1994 | Suzuki et al. |
| 5,454,880 | A | 10/1995 | Sariciftci et al. |
| 5,482,570 | A | 1/1996 | Saurer et al. |
| 6,559,375 | B1 | 5/2003 | Meissner et al. |
| 6,670,213 | B2 | 12/2003 | Halls et al. |
| 6,897,284 | B2 | 5/2005 | Liu et al. |
| 2004/0024171 | A1 | 2/2004 | McCullough et al. |
| 2005/0022865 | A1 | 2/2005 | Robeson et al. |
| 2005/0080219 | A1 | 4/2005 | Koller et al. |

FOREIGN PATENT DOCUMENTS

| EP | 1 028 136 A2 | 8/2000 |
|---|---|---|
| EP | 1 329 476 A1 | 7/2003 |

(Continued)

OTHER PUBLICATIONS

Brabec, C. J., et al., "Influence of Disorder on the Photoinduced Excitations in Phenyl Substituted Polythiophenes", Journal of Chemical Physics, vol. 115, No. 15, pp. 7235-7244 (2001).

(Continued)

*Primary Examiner*—Rodney G McDonald
(74) *Attorney, Agent, or Firm*—Foley & Lardner LLP

(57) ABSTRACT

Regioregular polythiophene polymers can be used in photovoltaic applications including copolymers and blends. The polymer can comprise heteroatoms in the side groups. Better efficiencies can be achieved.

6 Claims, 11 Drawing Sheets

FOREIGN PATENT DOCUMENTS

| | | |
|---|---|---|
| EP | 1 329 477 A1 | 7/2003 |
| WO | WO 2004/025746 A2 | 3/2004 |
| WO | WO 2005/107047 A2 | 11/2005 |

OTHER PUBLICATIONS

Coakley et al., "Conjugated Polymer Photovoltaic Cells," Chem. Mater., vol. 16, No. 23, 2004, pp. 4533-4542.

Coakley et al., "Infiltrating Semiconducting Polymers into Self-Assembled Mesoporous Titania Films for Photovoltaic Applications," Advanced Functional Materials, vol. 13, No. 4, 2003, pp. 301-306.

Coakley et al., "Photovoltaic Cells Made From Conjugated Polymers Infiltrated Into Mesoporous Titania," Applied Physics Letters, vol. 83, No. 16, 2003, pp. 3380-3382.

Daoust, G., et al., "Structure-Property Relationships in Alkoxy-Substituted Polythiophenes", Macromolecules, ACS, vol. 24, No. 2, pp. 455-459 (1991).

Dennler et al., "Flexible Conjugated Polymer-Based Plastic Solar Cells: From Basics to Applications," Proceedings of the IEEE, vol. 93, No. 8, 2005, pp. 1429-1439.

Kline et al., "Controlling the Field-Effect Mobility of Regioregular Polythiophene by Changing the Molecular Weight," Advanced Materials, vol. 15, No. 18, 2003, pp. 1519-1522.

Kline et al., "Dependence of Regioregular Poly(3-Hexylthiophene) Film Morphology and Field-Effect Mobility on Molecular Weight," Macromolecules, vol. 38, No. 8, 2005, pp. 3312-3319.

Liu et al., "Employing End-Functional Polythiophene to Control the Morphology of Nanocrystal-Polymer Composites in Hybrid Solar Cells," J. Am. Chem. Soc., vol. 126, pp. 6550-6551.

Liu et al., "Polythiophene Containing Thermally Removable Solubilizing Groups Enhances the Interface and the Performance of Polymer—Titania Hybrid Solar," J. Am. Chem. Soc., vol. 126, pp. 9486-9487.

McCullough et al., "Regioregular, Head-to-Tail Coupled Poly(3-Alkylthiphene) and its Derivatives," Handbook of Conducting Polymers, $2^{nd}$ Edition, Chapter 9, 1998, pp. 225-258.

McCullough, "The Chemistry of Conducting Polythiophenes," Advanced Materials, vol. 10, No. 2, 1998, pp. 93-116.

Rauch, T.,. et al., "Performance of bulk-heterojunction organic photodetectors", Nanotechnology, $4^{th}$ IEEE Conf. on Munich, Germany, pp. 632-634 Aug. 16-19, 2004).

Partial International Search Report, PCT/US2005/034043, Mar. 22, 2006.

HETEROATOMIC REGIOREGULAR POLY(3-SUBSTITUTEDTHIOPHENES) FOR PHOTOVOLTAIC CELLS

RELATED APPLICATIONS

This application claims priority to U.S. Provisional application Ser. No. 60/612,641, filed Sep. 24, 2005 to Williams et al, which is hereby incorporated by reference in its entirety.

BACKGROUND

While solar cell technology has steadily improved, a substantial leap is generally needed to achieve costs of, for example, $1 per watt and below, which will enable truly broad commercialization. Photovoltaics with conductive polymers as the p-type semiconductor, that are solution processed and printed in a large scale roll-to-roll process, have the potential to achieve this goal. Polymers are needed with the unique ability to be tailored to meet application requirements. Specifically, by tuning the band gap, energy levels, and processability, polymers are needed which can be the key to unlocking applications for solar cell technology.

A need exists for better photovoltaic devices which can be commercially processed well, can be synthetically tailored, can be reasonably priced, and can provide good efficiency and stability. In particular, polymer materials can provide good processability and synthetic versatility. Also needed is better use of nanotechnology and nanomaterials to control the polymer-based heterojunction.

US Patent Publication 2005/0022865 to Robeson et al. describes photovoltaic systems based on higher glass transition temperature polymers.

SUMMARY

Provided herein are developments in plastic electronics including, for example, photovoltaic devices where components are made of organic and/or plastic materials including inherently conductive polymers, other polymers, and small organic molecules. In particular, use of regio-regular, or well-defined, inherently conducting polymers, more specifically, regio-regular poly(3-substitutedthiophenes) in photovoltaic organic electronic devices are provided. For example, described herein is the use of regioregular poly(3-substitutedthiophenes) and their copolymers in which the 3-alkyl, 3-alkylaryl, or 3-aryl substituent possesses heteroatom substitution, such as O or S, as a p-type semiconductor in photovoltaic cells.

One embodiment provides a photovoltaic device comprising:
a first electrode,
a second electrode,
an active layer disposed between the first and second electrodes, wherein the active layer comprises at least one p-type component and at least one n-type component, wherein the p-type component comprises at least one polymer comprising regio-regular poly(3-substitutedthiophene) in which the 3-substituent is an alkyl, aryl, or alkyl/aryl moiety with a heteroatom substitution in either the α- or β-position of the 3-substituent.

Another embodiment provides a photovoltaic device comprising:
a first electrode,
a second electrode,
an active layer disposed between the first and second electrodes, wherein the active layer comprises at least one p-type component and at least one n-type component, wherein the p-type component comprises at least one polymer comprising regio-regular poly(3-substitutedthiophene) in which the 3-substituent is an alkyl, aryl, or alkyl/aryl moiety with a heteroatom substitution in either the α- or β-position of the 3-substituent, wherein the heteroatom is an O or S atom, and wherein the polymer is a homopolymer or a copolymer.

Another embodiment provides a photovoltaic device having low metal impurities in the p-type component comprising:
a first electrode,
a second electrode,
an active layer disposed between the first and second electrodes, wherein the active layer comprises at least one p-type component and at least one n-type component, wherein the p-type component consists essentially of at least one polymer consisting essentially of a regio-regular poly(3-substitutedthiophene) in which the 3-substituent is an alkyl, aryl, or alkyl/aryl moiety with a heteroatom substitution in either the α- or β-position of the 3-substituent, wherein the heteroatom is an O or S atom, and wherein the polymer is a homopolymer or a copolymer.

Another embodiment provides a photovoltaic device comprising:
a first electrode,
a second electrode,
an active layer disposed between the first and second electrodes, wherein the active layer comprises at least one p-type component and at least one n-type component, wherein the p-type component comprises at least one homopolymer or copolymer comprising regio-regular poly(3-substitutedthiophene) in which the 3-substituent is an alkyl, aryl, or alkyl/aryl moiety with a heteroatom substitution in either the alpha- or beta-position of the 3-substituent, wherein the active layer comprises multiple active layers.

Another embodiment provides a photovoltaic device comprising:
a first electrode,
a second electrode,
an active layer disposed between the first and second electrodes, wherein the active layer comprises at least one p-type component and at least one n-type component, wherein the p-type component comprises at least one copolymer comprising regio-regular poly(3-substitutedthiophene) in which the 3-substituent is an alkyl moiety with an oxygen heteroatom substitution in the α-position of the 3-substituent. The copolymer can further comprise a comonomer comprising an alkyl 3-substituent. The copolymer can further comprise a comonomer comprising an alkyl 3-substituent present in about 5 to about 25 mole percent.

The active layer further comprises a different polythiophene. The weight ratio of p-type to n-type material can be about 1:1 to about 3:1, or alternatively, about 1.5:1 to about 2.5:1. The active layer can comprise a polymer-fullerene heterojunction.

Also provided are methods of making photovoltaic devices and methods of using photovoltaic devices.

One of the basic and novel features is that the p-type material has metallic impurities at a level sufficiently low to allow for photovoltaic applications. In addition, the use of the heteroatom provides tunability to the photovoltaic device.

DETAILED DESCRIPTION

Figure 1:
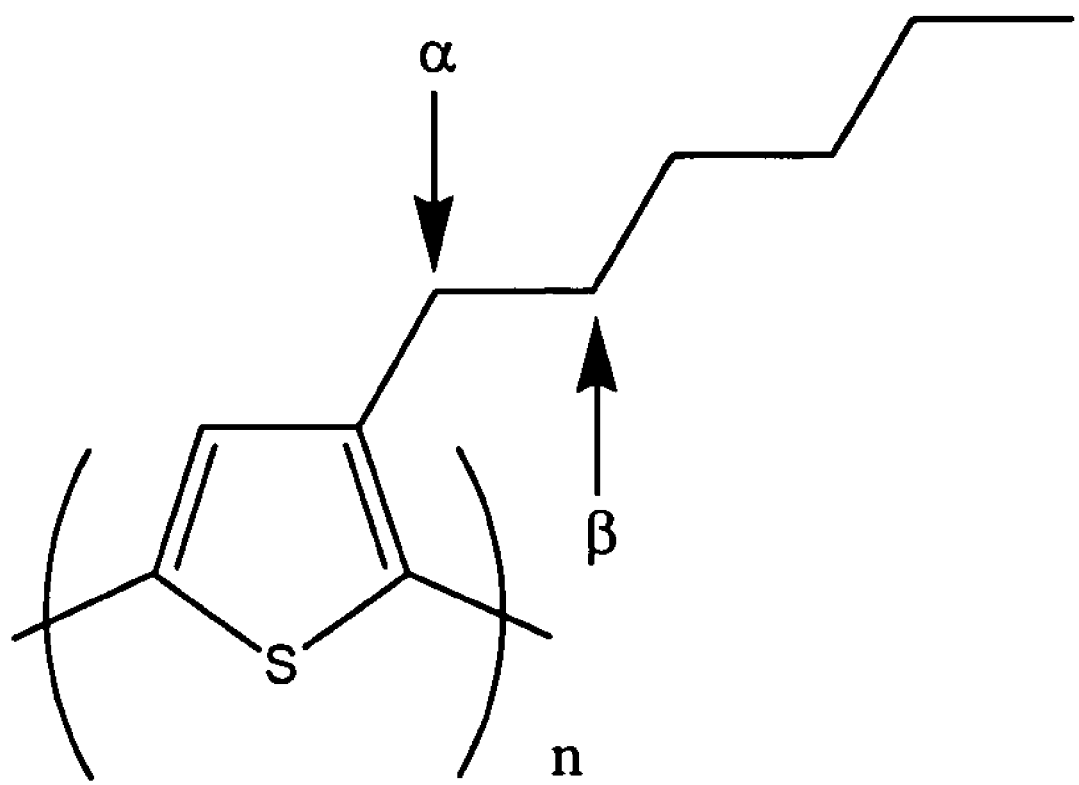
FIG. 1 illustrates regio-regular poly(3-substituted thiophene) with α and β positions of the 3-substituent indicated
Figure 2:
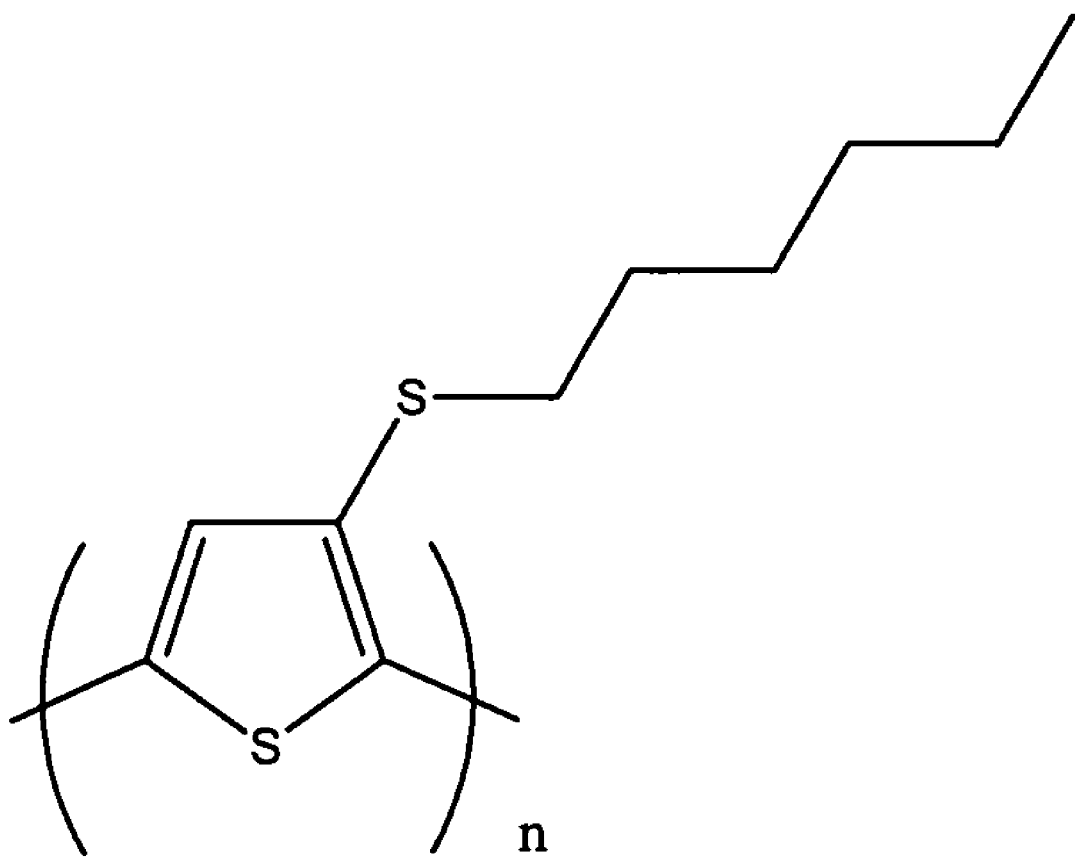
FIG. 2 illustrates poly(3-[α-thiaheptyl]thiophene), poly(3-substituted thiophene) with α hetero substitution
Figure 3:
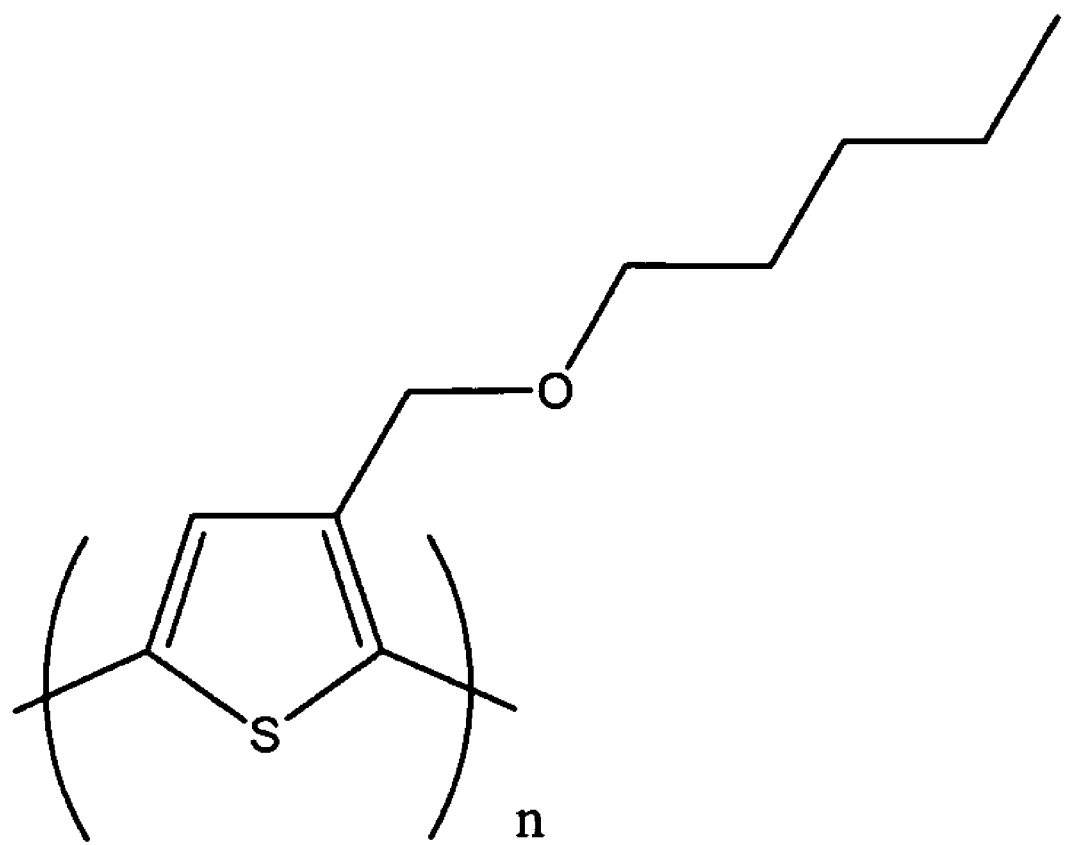
FIG. 3 illustrates poly(3-[β-oxaheptyl]thiophene), poly(3-substituted thiophene) with β hetero substitution
Figure 4:
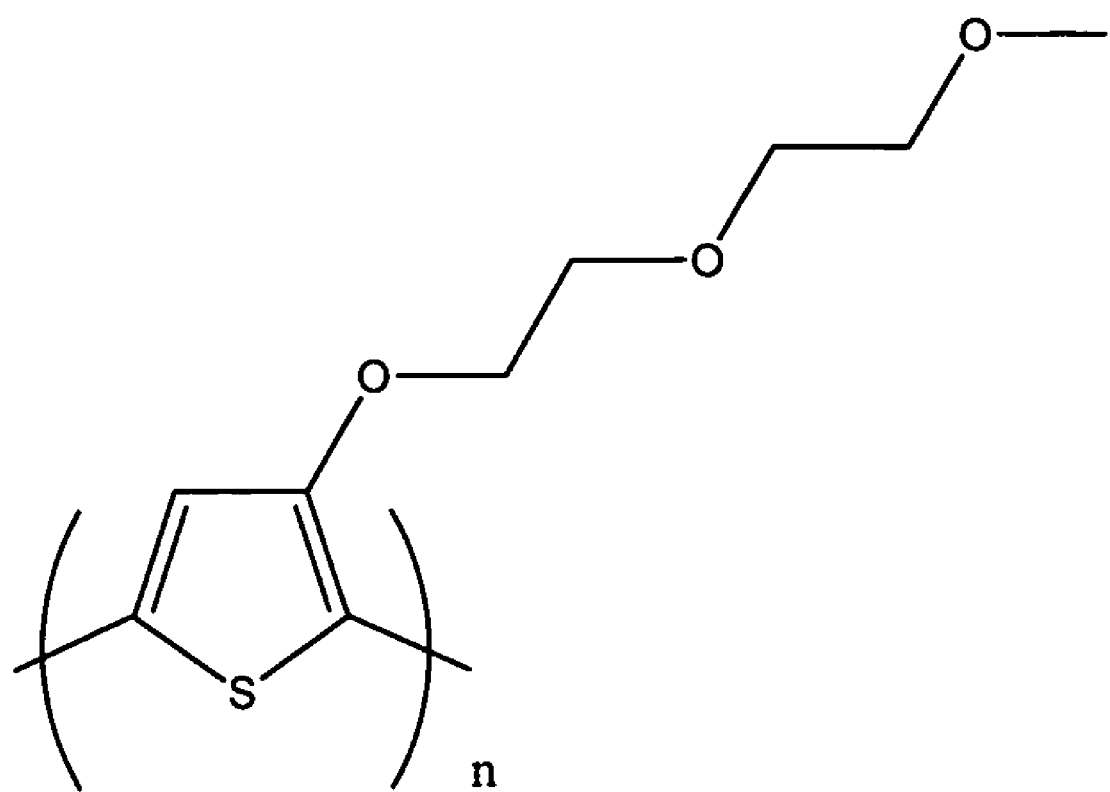
FIG. 4 illustrates poly(3-[α, δ, η-trioxaoctyl]thiophene), poly(3-substituted thiophene) with multiple hetero atom substitutions including an α hetero substitution.
Figure 5:
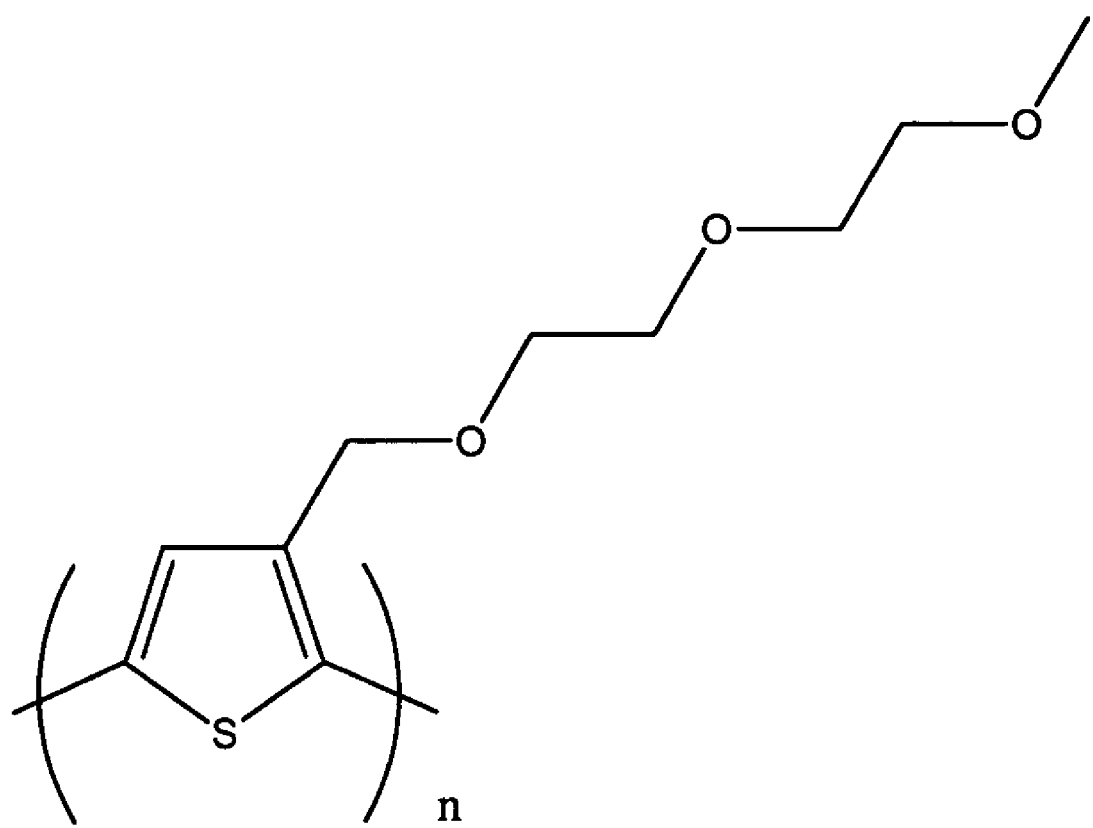
FIG. 5 illustrates poly(3-[β, ε, θ-trioxanonyl]thiophene), a poly(3-substituted thiophene) with multiple hetero atom substitutions including a β hetero substitution
Figure 6:
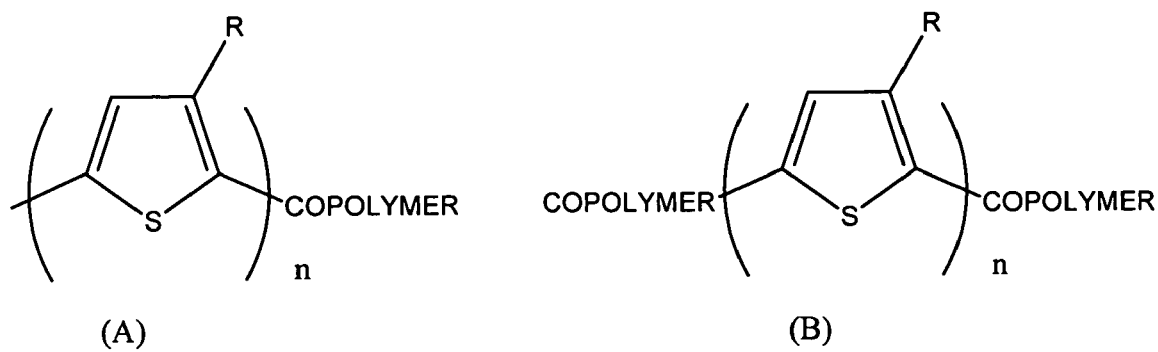
FIG. 6 illustrates schematic representation of different types of block copolymers including (A) AB type copolymer, and (B) ABA type copolymer, of regio-regular poly(3-substituted)thiophenes; wherein the B unit is a block polythiophene and the A unit is another type of copolymer block.

Priority U.S. Provisional application Ser. No. 60/612,641, filed Sep. 24, 2005, to Williams et al, is hereby incorporated by reference in its entirety including claims and figures.

Provisional application Ser. No. 60/661,934 filed Mar. 16, 2005 ("Copolymers of Soluble Poly(thiophenes) with Improved Electronic Performance") is also incorporated by reference herein in its entirety.

Copending application, Ser. No. 11/243,374 filed Sep. 26, 2005 to Williams et al. ("Heteroatomic Regioregular Poly(3-substitutedthiophenes) in electroluminescent devices"), as well as provisional filing 60/612,640 filed Sep. 24, 2004, are hereby incorporated by reference, describing OLED devices.

In the nomenclature described below for substitution sites for a heteroatom, the two systems can be used equivalently: (1) α, β, γ, etc. is equivalent to (2) 1, 2, 3, etc.

Photovoltaic Cells and Conjugated Polymers Generally

This invention has a variety of embodiments but generally relates to the use of regioregular poly(3-substitutedthiophenes) and their copolymers in which the 3-alkyl, aryl, or alkylaryl substituent possesses heteroatom substitution as a p-type semiconductor in photovoltaic cells. One skilled in the art can employ the below description in the practice of the present invention.

The use of organic or polymer materials in photovoltaic cells for the present invention offers many desirable properties such as improved efficiency of the cell, ease of processability of materials and components during cell production, the ability to use spin casting, drop casting, and printing techniques to apply the p-type semiconductor in photovoltaic cells, the ability to prepare more flexible photovoltaic cells, the ability to prepare low-weight photovoltaic cells, and the ability to prepare low cost photovoltaic cells. Other benefits are noted below.

A photovoltaic cell can be an electrochemical device that converts electromagnetic radiation to electrical energy. Although the present invention is not limited by theory, this can be accomplished through a charge separation event that occurs after absorption of a photon which causes the creation of an excited state, which can be referred to as an exciton, in a p-type semiconductor which is in intimate contact with an n-type semiconductor. Typically the semiconductor domains are sandwiched in one or more active layers between two electrodes, wherein at least one electrode is sufficiently transparent to allow for the passage of the photon. As known in the art, the value of such a device is that it may be used to directly convert solar radiation into usable energy without the generation of chemical waste products or a dependence on petroleum- or coal-based energy. This "clean" and renewable energy can be used to charge batteries or operate electronic devices. It offers advantages to any electrical application which is electrically driven by an electrical distribution grid, either as a replacement for a battery or as means to restore the charge on a battery which is then used to power a device. Finally, it can be used to supplement power supply on the electrical distribution grid or to replace power supply from the electrical distribution grid.

The photovoltaic cells can comprise at least four components, two of which are electrodes. One component is a transparent first electrode such as indium tin oxide coated onto plastic or glass which functions as a charge carrier, typically the anode, and allows ambient light to enter the device. Another component is a second electrode which can be made of a metal such as calcium or aluminum. In some cases, this metal may be coated onto a supporting surface such as a plastic or glass sheet. This second electrode also carries current. Between these electrodes are either discrete layers or a mixture of p- and n-type semiconductors, the third and fourth components. The p-type material can be called the primary light harvesting component or layer. This material absorbs a photon of a particular energy and generates a state in which an electron is promoted to an excited energy state, leaving a positive charge or "hole" in the ground state energy levels. As known in the art, this is known as exciton formation. The exciton diffuses to a junction between p-type and n-type material, creating a charge separation or dissociation of the exciton. The electron and "hole" charges are conducted through the n-type and p-type materials respectively to the electrodes resulting in the flow of electric current out of the cell. In addition to the heteroatomic regioregular polythiophene polymers described further below, the p-type semiconductor can also comprise conjugated polymers including, for example, mixtures or blends of materials including use of poly-phenylenevinylene (PPV) or poly (3-hexyl)thiophene (P3HT). The n-type component can comprise materials with a strong electron affinity including, for example, carbon fullerenes, titanium dioxide, cadmium selenium, and polymers and small molecules that are specifically designed to exhibit n-type behavior.

Performance of photovoltaic cells can be determined by measurement of the efficiency of conversion of light energy to electrochemical energy as measured by the quantum efficiency (number of photons effectively used divided by the number of photons absorbed) and by the peak output power generated by the cell (given by the product $I_{pp}V_{pp}$ where $I_{pp}$ is the current and $V_{pp}$ is the voltage at peak power). For comparison, efficiencies of crystalline silicon based devices range from 15% (commercial) to 35% (laboratory); amorphous silicon solar cells are cheaper than crystalline but achieve 8-20% efficiency; dye-sensitized solar cells achieve 5-10% efficiency and polymer based solar cells in general currently achieve 4-6% efficiency.

A metric for economic efficiency of solar cells can be $/Watt, given by the cost per unit area divided by the watt output per unit area. Current materials are too costly to result in ubiquitous use of photovoltaic cells in our society, typically $4-6/Watt in an installed system where less than $2/Watt is widely viewed as the key to broad commercialization. At this time, for comparison, silicon based photovoltaics are prepared in production facilities that are expensive to build and maintain. Processing techniques for the n- and p-type semiconductors in the most efficient crystalline silicon-based cells are arduous and costly, with a continual push to increasingly large silicon wafers to reduce cost. While the constraint of silicon wafer size limits the maximum size of single photovoltaic cells, the push for large wafers also makes small cells (e.g. for mobile consumer electronics products) expensive due to the added cost and technical challenge of dicing large silicon wafers into small usable solar cells. For comparison, traditional silicon-based photovoltaics have further limitations in that they are heavy and rigid and cannot be used to prepare flexible photovoltaic cells.

Polymer based solar cells can provide the next generation of photovoltaics. These materials offer several advantages. They can be dissolved in common organic solvents and can be easily processed by spin-coating, drop casting, dip coating, spraying, and various printing techniques (ink-jet, off-set, and transfer). They can be processed in large-area formats (e.g. roll-to-roll manufacturing) in production facilities that are inexpensive to build and maintain, thereby lowering the potential cost per watt of photovoltaics. The polymer-based materials also offer several advantages in performance that will be discussed below. Novel polymeric, p-type materials can enable the ubiquitous use of photovoltaic cells as an energy harvesting technology.

Polythiophene

One skilled in the art can employ the below description about poly(thiophene) in the practice of the present invention. As known in the art, poly(thiophene) has a conjugated $\pi$-electron band structure that makes it a strong absorber of light in the visible spectrum and hence a candidate p-type semiconductor for photovoltaic cells. Poly(thiophenes) can be prepared by various chemical and electrochemical transformations of suitably substituted thiophenes that result, primarily in the coupling of the thiophene rings at the 2- and 5-positions of the monomer. The degree of other modes of coupling of these thiophene moieties depends on the method employed and can afford polymers and/or oligomers of varying regio-regularity.

As known in the art, the absorbance characteristics of poly (thiophene) reflect the $\pi$-$\pi$* transition of the conjugated band structure. It is this absorption that generates the exciton that eventually leads to power output in a suitably designed photovoltaic. The extent of this conjugated structure is dependent upon the polymer chains to form a planar conformation in the solid state. Although the present invention is not limited by theory, this may be because conjugation from ring-to-ring is dependent upon $\pi$-orbital overlap. If a particular ring is twisted out of planarity, the overlap cannot occur and the conjugation band structure is lost. Some minor twisting is not detrimental since the degree of overlap between thiophene rings varies as the cosine of the dihedral angle between them.

As known in the art, performance of a conjugated polymer as a p-type semiconductor in a photovoltaic is also dependant upon the morphology of the polymer in the solid state. Electronic properties are dependent upon the electrical connectivity and inter-chain charge transport between polymer chains. Pathways for charge transport can be along a polymer chain or between adjacent chains. Transport along a chain requires a planar backbone conformation due to the dependence of the charge carrying moiety on the amount of double-bond character between the rings. This conduction mechanism between chains requires either a stacking of planar, polymer segment, called $\pi$-stacking, or an inter-chain hopping mechanism in which excitons or electrons can tunnel or "hop" through space or other matrix to another chain that is in proximity to the one that it is leaving.

Therefore, processes that can drive ordering of polymer chains in the solid state can help to improve the performance of the conjugated polymer as a component of a photovoltaic device. It is known that the absorbance characteristics of thin films of regioregular polythiophenes reflect the increased $\pi$-stacking which occurs in the solid state.

The amount of $\pi$-overlap and charge density in this $\pi$-system also determines the energy of the $\pi$-$\pi$* transition for a conjugated polymer. In photovoltaic cell applications, this absorption determines the amount and intensity of the solar spectrum that may be utilized by the device. Consequently, the nature of the p-type semiconductor strongly impacts the efficiency and performance of the photovoltaic cell.

Polymer Purity

To effectively use a conjugated polymer as a p-type semiconductor for this application, it should be prepared by a method that allows the removal of organic and ionic impurities from the polymeric matrix. The presence of impurities, notably metal ions, in this material may have serious deleterious effects on the performance of resulting photovoltaic cells. These effects include charge localization or trapping, quenching of generated excitons, reduction of charge mobility, interfacial morphology effects such as phase separation, and oxidation or reduction of the polymer into a more highly conductive state which is not suitable for photovoltaic applications. There are several methods by which impurities may be removed from a conjugated polymer. Most of these are facilitated by the ability to dissolve the polymer in common organic and polar solvents. For comparison, poly(thiophene) is, essentially, insoluble in its semi-conductive state.

Poly(3-Substituted Thiophenes)

The following description of poly(3-substituted thiophenes) can be also used by one skilled in the art in practicing the invention. It has been shown, for example, that some poly(3-substituted thiophenes) with alkyl, aryl, and alkylaryl substituents are soluble in common organic solvents such as THF, chloroform, toluene and xylene. These materials share a common conjugated $\pi$-electron band structure, similar to that of poly(thiophene), as described above, that makes them suitable p-type semiconductors for photovoltaic cells, but due to their solubility they are much easier to process and purify than poly(thiophene). These materials can be made as oligomer chains such as (3-alkythiophene)$_n$, (3-arylthiophene)$_n$, or (3-alkyl/arylthiophene)$_n$ in which n is the number of repeat units with a value of 2-10 or as polymers in which n=11-350 and higher, but for these materials n most typically has a value of 50-200.

However, adding a 3-substituent to the thiophene ring makes the thiophene repeat unit asymmetrical. Polymerization of a 3-substituted thiophene by conventional methods results in 2,5'-couplings, but also in 2,2'- and 5,5'-couplings. The presence of 2,2'-couplings or a mixture of 2,5'-, 2,2'- and 5,5'-couplings can result in steric interactions between 3-substituents on adjacent thiophene rings which can create torsional strain between the rings. The rings then rotate out of a planar conformation to another, thermodynamically more stable, conformation which minimizes the steric interactions from such couplings. This results in reduction of p-orbital overlap between adjacent thiophene rings, and if severe enough, the net conjugation length decreases and with it the conjugated band structure of the polymer. The combination of these effects impairs the performance of photovoltaic cells made from these regio-randomly coupled poly(3-substitutedthiophenes).

U.S. Pat. No. 4,711,742 to Jen et al. describes polythiophene polymers.

Regio-Regular Polymers

Previously in the art, it has been demonstrated that materials with superior π-conjugation, electrical communication, and solid state morphology could be prepared by using regiospecific chemical coupling methods that produced >95% 2,5'-couplings of poly(3-substituted thiophenes) with alkyl substituents. These materials have been prepared via the use of a Kumada-type nickel-catalyzed coupling of a 2-bromo,-5-magnesiobromo-3-substituted thiophene as well as by the zinc coupling in the Reike methods. A more practical preparative synthesis of a regio-regular poly(3-substituted thiophene) with alkyl substituents was affected by the Grignard metathesis of a 2,5-dibromo-3-alkylthiophene, followed by nickel cross coupling.

Like regio-random poly(3-substituted thiophenes) with alkyl, aryl, and alkyl/aryl substituents, regio-regular poly(3-substituted thiophenes) with alkyl, aryl, and alkyl/aryl substituents are soluble in common organic solvents and demonstrate enhanced processability in applications by deposition methods like spin-coating, drop casting, dip coating, spraying, and printing techniques (e.g. ink-jet, off-set, and transfer). Therefore, these materials can be better processed in large-area formats as p-type semiconductors for photovoltaic applications when compared to regio-random poly(3-substituted thiophenes). Furthermore, because of the homogeneity of their 2,5'-ring-to-ring couplings, they exhibit evidence of substantial π-conjugation and high extinction coefficients for the absorption of visible light corresponding to the π-π* absorption for these materials. This absorption determines the amount and intensity of the solar spectrum that may be utilized when a regioregular poly(3-substituted thiophene) with alkyl, aryl, or alkyl/aryl substituents is used as a p-type semiconductor. Other factors like work function, mobility, and processing techniques determine the efficiency and performance of the photovoltaic cell. For these reasons, regio-regular poly(3-hexyl thiophene) is most commonly used as a polymeric p-type semiconductor in polymer-based photovoltaic cells.

Another benefit of the regio-regularity of these materials is that they can self-assemble in the solid state and form well-ordered structures. These structures tend to juxtapose thiophene rings systems through a π-stacking motif and allow inter-chain charge transport through this bonding arrangement between separate polymers, enhancing the conductive properties when compared to regio-random polymers. Therefore, we recognize a morphological benefit to these materials.

As is the case with the use poly(thiophene) as a p-type semiconductor in a photovoltaic device, the presence of impurities, notably metal ions, in this regioregular material may have serious deleterious effects on the performance of resulting photovoltaic cells. These effects include charge localization or trapping, quenching of the exciton, reduction of charge mobility, interfacial morphology effects such as phase separation, and oxidation or reduction of the polymer into a truly conductive state which is not suitable for photovoltaic applications. There are several methods by which impurities may be removed from a conjugated polymer. Most of these are facilitated by the ability to dissolve the polymer in common organic and polar solvents. The solubility of these materials facilitates their purification such that they can be made suitable for their application as p-type semiconductors for photovoltaic devices.

Methods described in the art are purportedly provided by US Patent Publication No. 2005/0080219 to Koller et al.

Heteroatoms in Side Groups of Polythiophenes

Synthetic methods, doping, and polymer characterization, including regioregular polythiophenes with heteroatoms in the side groups, is provided in, for example, U.S. Pat. No. 6,602,974 to McCullough et al. and U.S. Pat. No. 6,166,172 to McCullough et al., which are hereby incorporated by reference in their entirety. Additional description can be found in the article, "The Chemistry of Conducting Polythiophenes," by Richard D. McCullough, *Adv. Mat.*, 10, No. 2, pages 93-116, and references cited therein, which is hereby incorporated by reference in its entirety. In particular, section 4 describes "Chemical Synthesis of Heteroatomic Functionalized Substituents on PTs: Recognition Sites for Self-Assembly and Chemical Sensing." Another reference which one skilled in the art can use is the *Handbook of Conducting Polymers*, $2^{nd}$ Ed., 1998, Chapter 9, by McCullough et al., "Regioregular, Head-to-Tail Coupled Poly(3-alkylthiophene) and its Derivatives," pages 225-258, which is hereby incorporated by reference in its entirety. In particular, section VI describes heteroatomic substituents on HT PATs including ether groups and thioalkyl groups. This reference also describes, in chapter 29, "Electroluminescence in Conjugated Polymers" at pages 823-846, which is hereby incorporated by reference in its entirety, including the sections on photoconductive polymers (pages 838-840).

In addition, electrically conductive polymers are described in *The Encyclopedia of Polymer Science and Engineering*, Wiley, 1990, pages 298-300, including polyacetylene, poly (p-phenylene), poly(p-phenylene sulfide), polypyrrole, and polythiophene, which is hereby incorporated by reference in its entirety. This reference also describes blending and copolymerization of polymers, including block copolymer formation.

Heteroatom Substitution in Regioregular Polythiophenes—Alpha Substitution by Oxygen Regio-regular poly(3-substituted thiophenes) with alkyl, aryl, and alkyl/aryl substituents and an oxygen atom in the α-position of the 3-substituent has also been prepared by the McCullough (nickel cross-coupling of 2-bromo-5-magnesiobromo-3-alkoxythiophene) and GRIM (Grignard metathesis of a 2,5-dibromo-3-alkoxythiophene followed by a nickel cross-coupling reaction) methods. Specific examples of this class of materials include poly(3-substituted thiophenes) with 1-oxaheptyl and 1,4,7-trioxaoctyl substituents. In some instances, the 3-substitutent may contain a heteroatom other than oxygen in addition to an oxygen atom in the α-position. The degree of regioregularity can be, for example, at least about 90%, or at least about 95%, or at least about 98%. The amount of regio-regular 2,5'-couplings for these materials can exceed 95%.

Regio-regular poly(3-substituted thiophenes) with alkyl, aryl, and alkyl/aryl substituents and an oxygen atom in the α-position of the 3-substituent demonstrate the same enhanced performance as other regio-regular poly(3-substituted) thiophenes with alkyl, aryl, and alkyl/aryl substituents with regard to processability, defect-free electronic structure, high extinction coefficient, high electronic mobility, improved solid-state morphology, and increased solubility, but they offer some other benefits as well. The effect of the oxygen substitution is to decrease the energy of the band gap associated with the $\pi$-$\pi$* transition for the material. This substitution red-shifts the absorption profile compared to a regio-regular poly(3-substituted thiophenes) with alkyl, aryl, and alkyl/aryl substituents into a regime of solar radiation possessing greater emission. This red-shifts the absorption of the polymer toward the maximum photon flux of the solar radiation spectrum. Therefore, when incorporated into photovoltaic devices, a higher efficiency may be observed. Furthermore, the heteroatom functionality increases the solubility of this material in polar organic solvents like tetrahydrofuran, dimethylformamide (DMF), 1-methoxy-2-propanol acetate (PMA), and chloroform, and enhances the processing options for this material and allows the selective dissolution of this layer in the presence of other device components.

As is the case with the use of poly(thiophene) as a p-type semiconductor in a photovoltaic device, the presence of impurities, notably metal ions, in this material may have serious deleterious effects on the performance of resulting photovoltaic cells. These effects include charge localization or trapping, quenching of the exciton, reduction of charge mobility, interfacial morphology effects such as phase separation, and oxidation or reduction of the polymer into a truly conductive state which is not suitable for photovoltaic applications. There are several methods by which impurities may be removed from a conjugated polymer. Most of these are facilitated by the ability to dissolve the polymer in common organic and polar solvents. The solubility of these materials facilitates their purification such that they can be made suitable for their application as p-type semiconductors for photovoltaic devices.

These materials can be made as oligomer chains such as (3-alkoxythiophene)$_n$, (3-aryloxythiophene)$_n$, or (3-alkyl/aryloxythiophene)$_n$ in which n is the number of repeat units with a value of 2-10 or as polymers in which n=11-350 and higher, but for these materials n most typically has a value of about 50 to about 200 when used as a p-type semiconductor in a photovoltaic device.

Beta-Position Oxygen Substitution

Regio-regular poly(3-substitutedthiophenes) with alkyl, aryl, and alkyl/aryl substituents and an oxygen atom in the β-position of the 3-substituent has also been prepared by the McCullough (nickel cross-coupling of 2-bromo-5-magnesio-bromo-3-alkoxythiophene) and GRIM (Grignard metathesis of a 2,5-dibromo-3-alkoxythiophene followed by a nickel cross-coupling reaction) methods. Specific examples of this class of materials include poly(3-substitutedthiophenes) with 2,5-dioxahexyl and 2,5,8-trioxanonyl substituents. In some instances, the 3-substitutent may contain a heteroatom other than oxygen in addition to an oxygen atom in the β-position. The amount of regio-regular 2,5'-couplings for these materials can exceed 95%.

Regio-regular poly(3-substitutedthiophenes) with alkyl, aryl, and alkyl/aryl substituents and an oxygen atom in the β-position of the 3-substituent demonstrate the same enhanced performance as other regio-regular poly(3-substituted) thiophenes with alkyl, aryl, and alkyl/aryl with regard to processability, defect-free electronic structure, high extinction coefficient, high electronic mobility, improved solid-state morphology, and increased solubility, but they offer some other benefits as well. The effect of the oxygen substitution is to decrease the size of the band gap associated with the $\pi$-$\pi$* transition for the material. It also modestly red-shifts the lambda max of the material, allowing for specific high-energy absorption of solar radiation. Furthermore, the heteroatom functionality increases the solubility of this material in polar organic solvents like tetrahydrofuran, dimethylformamide (DMF), 1-methoxy-2-propanol acetate (PMA), and chloroform, which enhances the processing options for this material and allows the selective dissolution of this layer in the presence of other device components.

As is the case with the use of poly(thiophene) as a p-type semiconductor in a photovoltaic device, the presence of impurities, notably metal ions, in this material may have serious deleterious effects on the performance of resulting photovoltaic cells. These effects include charge localization or trapping, quenching of the exciton, reduction of charge mobility, interfacial morphology effects such as phase separation, and oxidation or reduction of the polymer into a truly conductive state which is not suitable for photovoltaic applications. There are several methods by which impurities may be removed from a conjugated polymer. Most of these are facilitated by the ability to dissolve the polymer in common organic and polar solvents. The solubility of these materials facilitates their purification such that they can be made suitable for their application as p-type semiconductors for photovoltaic devices.

These materials can be made as oligomer chains such as (3-β-oxaalkylthiophene)$_n$, (3-β-oxaarylthiophene)$_n$, or (3-β-oxaalkyl/arylthiophene)$_n$ in which n is the number of repeat units with a value of 2-10 and or as polymers in which n=11-350 or higher, but for these materials n most typically has a value of about 50 to about 200.

Heteroatom in Alpha Position

Regio-regular poly(3-substituted thiophenes) with alkyl, aryl, and alkyl/aryl substituents and a heteroatom in the α-position of the 3-substituent has also been prepared by the McCullough (nickel cross-coupling of 2-bromo-5-magnesio-bromo-3-α-heteroalkylthiophene) and GRIM (Grignard metathesis of a 2,5-dibromo-3-α-heteroalkylthiophene followed by a nickel cross-coupling reaction) methods. The heteroatom in the alpha position can be, for example, oxygen and sulfur. Specific examples of this class of materials include poly(3-substituted thiophenes) with 1-thiaheptyl substituent. In some instances, the 3-substitutent may contain a heteroatom addition to a hetero atom in the α-position. The amount of regio-regular 2,5'-couplings for these materials exceeds 95%.

Regio-regularpoly(3-substitutedthiophenes) with alkyl, aryl, and alkyl/aryl substituents and a hetero atom in the α-position of the 3-substituent demonstrate the same enhanced performance as other regio-regular poly(3-substituted) thiophenes with alkyl, aryl, and alkyl/aryl with regard to processability, defect-free electronic structure, high extinction coefficient, high electronic mobility, improved solid-state morphology, and increased solubility, but they offer some other benefits as well. The effect of the hetero atom substitution is to modify the band gap associated with the $\pi$-$\pi$* transition relative to that of other regio-regular poly(3-substitutedthiophenes). This "tunability" of the band-gap offers diverse opportunities for the generation of specific absorptive needs for organic photovoltaic devices. Furthermore, the heteroatom functionality increases the solubility of this material in polar organic solvents like tetrahydrofuran, dimethylformamide (DMF), 1-methoxy-2-propanol acetate (PMA), and chloroform, which enhances the processing options for this material and allows the selective dissolution of this layer in the presence of other device components.

As is the case with the use of poly(thiophene) as a p-type semiconductor in a photovoltaic device, the presence of impurities, notably metal ions, in this material may have serious deleterious effects on the performance of resulting photovoltaic cells. These effects include charge localization or trapping, quenching of the exciton, reduction of charge mobility, interfacial morphology effects such as phase separation, and oxidation or reduction of the polymer into a truly conductive state which is not suitable for photovoltaic applications. There are several methods by which impurities may be removed from a conjugated polymer. Most of these are facilitated by the ability to dissolve the polymer in common organic and polar solvents. The solubility of these materials facilitates their purification such that they can be made suitable for their application as p-type semiconductors for photovoltaic devices.

These materials can be made as oligomer chains such as (3-α-heteroalkylthiophene)$_n$, (3-α-heteroarylthiophene)$_n$, or (3-α-heteroalkyl/arylthiophene)$_n$ in which n is the number of repeat units with a value of 2-10 or as polymers in which n=11-350 or higher, but for these materials n most typically has a value of about 50 to about 200.

Heteroatom in Beta Position

Regio-regular poly(3-substitutedthiophenes) with alkyl, aryl, and alkyl/aryl substituents and a hetero atom in the β-position of the 3-substituent has also been prepared by the McCullough (nickel cross-coupling of 2-bromo-5-(magnesiobromo)-3-(β-heteroalkylthiophene)) and GRIM (Grignard metathesis of a 2,5-dibromo-3-(-(β-heteroalkylthiophene) followed by a nickel cross-coupling reaction) methods. Specific examples of this class of materials include poly(3-substitutedthiophenes) with 2-thiaoctyl substituents. The heteroatom in the beta position can be, for example, O or S. In some instances, the 3-substituent may contain a heteroatom other than the heteroatom in the β-position. The amount of regio-regular 2,5'-couplings for these materials can exceeds 95%.

Regio-regular poly(3-substitutedthiophenes) with alkyl, aryl, and alkyl/aryl substituents and a hetero atom in the β-position of the 3-substituent demonstrate the same enhanced performance as other regio-regular poly(3-substituted) thiophenes with alkyl, aryl, and alkyl/aryl with regard to processability, defect-free electronic structure, high extinction coefficient, high electronic mobility, improved solid-state morphology, and increased solubility, but they offer some other benefits as well. The effect of the heteroatom substitution is to modify the band gap associated with the π-π* transition relative to that of other regio-regular poly(3-substitutedthiophenes). This "tunability" of the band-gap offers diverse opportunities for the generation of specific absorptive needs for organic photovoltaic devices. Furthermore, the heteroatom functionality increases the solubility of this material in polar organic solvents like tetrahydrofuran and chloroform, which enhances the options for processing this material and allows more opportunities to selectively dissolve this layer in the presence of other device components.

As is the case with the use of poly(thiophene) as a p-type semiconductor in a photovoltaic device, the presence of impurities, notably metal ions, in this material may have serious deleterious effects on the performance of resulting photovoltaic cells. These effects include charge localization or trapping, quenching of the exciton, reduction of charge mobility, interfacial morphology effects such as phase separation, and oxidation or reduction of the polymer into a truly conductive state which is not suitable for photovoltaic applications. There are several methods by which impurities may be removed from a conjugated polymer. Most of these are facilitated by the ability to dissolve the polymer in common organic and polar solvents. The solubility of these materials facilitates their purification such that they can be made suitable for their application as p-type semiconductors for photovoltaic devices.

These materials can be made as oligomer chains such as (3-β-heteroalkylthiophene)$_n$, (3-β-heteroarylthiophene)$_n$, or (3-β-heteroalkyl/arylthiophene)$_n$ in which n is the number of repeat units with a value of 2-10 or as polymers in which n=11-350 or higher, but for these materials n most typically has a value of about 50 to about 200.

Homopolymers, Copolymers, and Blends

Use of a regio-regular poly(3-substitutedthiophene) is described in which the 3-substitutent is an alkyl, aryl, or alkyl/aryl moiety with an oxygen substitution in either the α- or β-position of the 3-substituent or a hetero atom in either the α- or β-position of the 3-substituent including homopolymers and mixed systems such as copolymers and blends of these materials as a p-type semiconductor component of a photovoltaic device.

The number of different types of repeat units in the copolymer configuration is not particularly limited. A copolymer of these materials can be, for example, a homo-, block-, alternating-, and random-copolymers of which incorporate one or more of the materials defined as a regio-regular poly(3-substitutedthiophene) in which the 3-substitutent is an alkyl, aryl, or alkyl/aryl moiety with an oxygen substitution in either the α- or β-position of the 3-substituent or a hetero atom in either the α- or β-position of the 3-substituent or as a copolymer of a regio-regular poly(3-substitutedthiophene) in which the 3-substitutent is an alkyl, aryl, or alkyl/aryl moiety with an oxygen substitution in either the α- or β-position of the 3-substituent or a hetero atom in either the α- or β-position of the 3-substituent with blocks composed of polymers built from monomers such as CH$_2$CH Ar, where Ar=any aryl or functionalized aryl group, isocyanates, ethylene oxides, conjugated dienes, CH$_2$CH$_2$R where R=H, alkyl, Cl, Br, F, OH, lactam, lactone, siloxanes, ATRP macroinitiators. Copolymeric systems are described extensively in U.S. Pat. No. 6,602,974, which is incorporated by reference in its entirety including for all of its copolymer types.

In addition, a copolymer can be, for example, a random or well-defined copolymer a regio-regular poly(3-substituted thiophene) in which the 3-substitutent is an alkyl, aryl, or alkyl/aryl moiety with an oxygen substitution in either the α- or β-position of the 3-substituent or a hetero atom in either the α- or β-position of the 3-substituent or as a copolymer of a regio-regular poly(3-substitutedthiophene) in which the 3-substitutent is an alkyl, aryl, or alkyl/aryl moiety with an oxygen substitution in either the α- or β-position of the 3-substituent or a hetero atom (such as "S," with appropriate substitution to complete valence requirements) in either the α- or β-position of the 3-substituent with a block comprised of one or more functionalized thiophene derivatives, or as a regio-regular poly(3-substituted thiophene) in which the 3-substitutent is an alkyl, aryl, or alkyl/aryl moiety with an oxygen substitution in either the α- or β-position of the 3-substituent or a hetero atom in either the α- or β-position of the 3-substituent or as a copolymer of a regio-regular poly(3-substitutedthiophene) in which the 3-substitutent is an alkyl, aryl, or alkyl/aryl moiety with an oxygen substitution in either the α- or β-position of the 3-substituent or a hetero atom in either the α- or β-position of the 3-substituent as a copolymer with random or well-defined copolymer comprised of one or more thiophene units.

In addition, a copolymer can be, for example, a regio-regular poly(3-substituted thiophene) in which the 3-substitutent is an alkyl, aryl, or alkyl/aryl moiety with an oxygen substitution in either the α- or β-position of the 3-substituent or a hetero atom in either the α- or β-position of the 3-substituent or as a copolymer of a regio-regular poly(3-substitutedthiophene) in which the 3-substitutent is an alkyl, aryl, or alkyl/aryl moiety with an oxygen substitution in either the α- or β-position of the 3-substituent or a hetero atom in either the α- or β-position of the 3-substituent with blocks of random or well-defined polymer comprised of one or more functionalized oligothiophenes which is also random or well defined.

A photoelectric device can be a set of materials that effectively perform the function of light absorption, creating electrical charges that are transported or conducted to electrodes such that electrical power in the form of current flow across a potential which can be used to power or charge an electrical device.

Active Layer

An active layer can have a combination of p- and n-type semiconductors and can exist in a number of different embodiments. It can comprise, for example: (i) two distinct, adjacent, and separate layers of p- and n-type materials; (ii) a single mixed layer of p- and n-type materials; (iii) a mixed but phase-separated layer of p- and n-type materials; (iv) a combination in which one or both materials are organized into a discrete structural unit or array; or (v) a combination in which one or both materials are bound to a non-active organizing matrix such as a polymer or supramolecular scaffold.

In one embodiment, the p- and n-type semiconductor materials are bonded to each other. The bonding can be ionic or covalent bonding. Coordinate bonding can be used. For example, one material can have a nucleophilic group and the other material can have an electrophilic group which can react with each other to form a covalent linkage. Covalent bonding methods are known in the art including, for example, reactions of amines with aldehydes, carboxylic acids, or esters.

The active layer can be manufactured by known methods including, for example, spin casting, drop casting, vapor deposition or sputtering, crystalline growth, patterned etching, dip coating, or by printing techniques such as ink-jetting, off-setting, transfer processes, or by spray applications.

Six Embodiments

Figure 7:
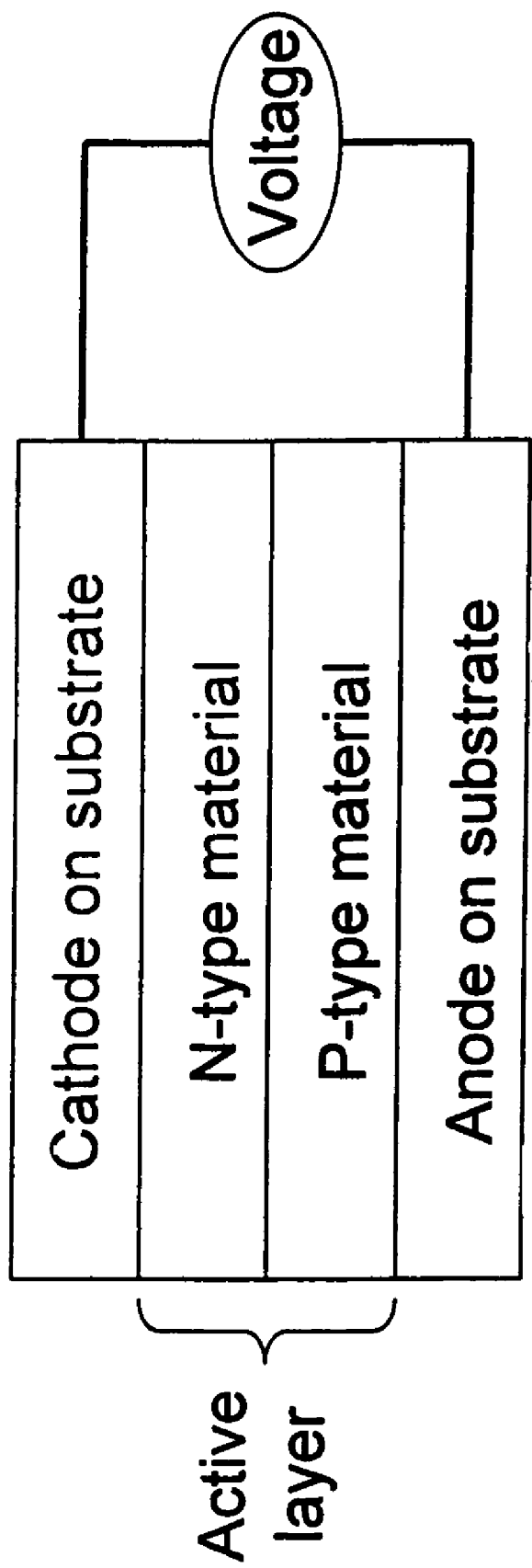
FIG. 7 illustrates one embodiment comprising an anode on a substrate, a p-type material, an n-type material, and a cathode on a substrate.

A first embodiment of this invention is a photovoltaic device wherein the active layer is a combination of a p-type material comprising a regio-regular poly(3-substituted thiophene) in which the 3-substitutent is an alkyl, aryl, or alkyl/aryl moiety with an oxygen substitution in either the α- or β-position of the 3-substituent or a hetero atom in either the α- or β-position of the 3-substituent as well as copolymers of these materials and an n-type material such as the following: fullerene based materials (such as the methanofullerene commonly referred to as PCBM), metal oxide nanoparticles (such as $TiO_2$, ZnO, etc.), coated metal oxide nanoparticles (such as $TiO_2$, ZnO, etc.), carbon nanotubes, CdSe materials and other similarly functioning type of material, and n-doped silicon or germanium. FIG. 7 provides an illustration of the first embodiment.

Figure 8:
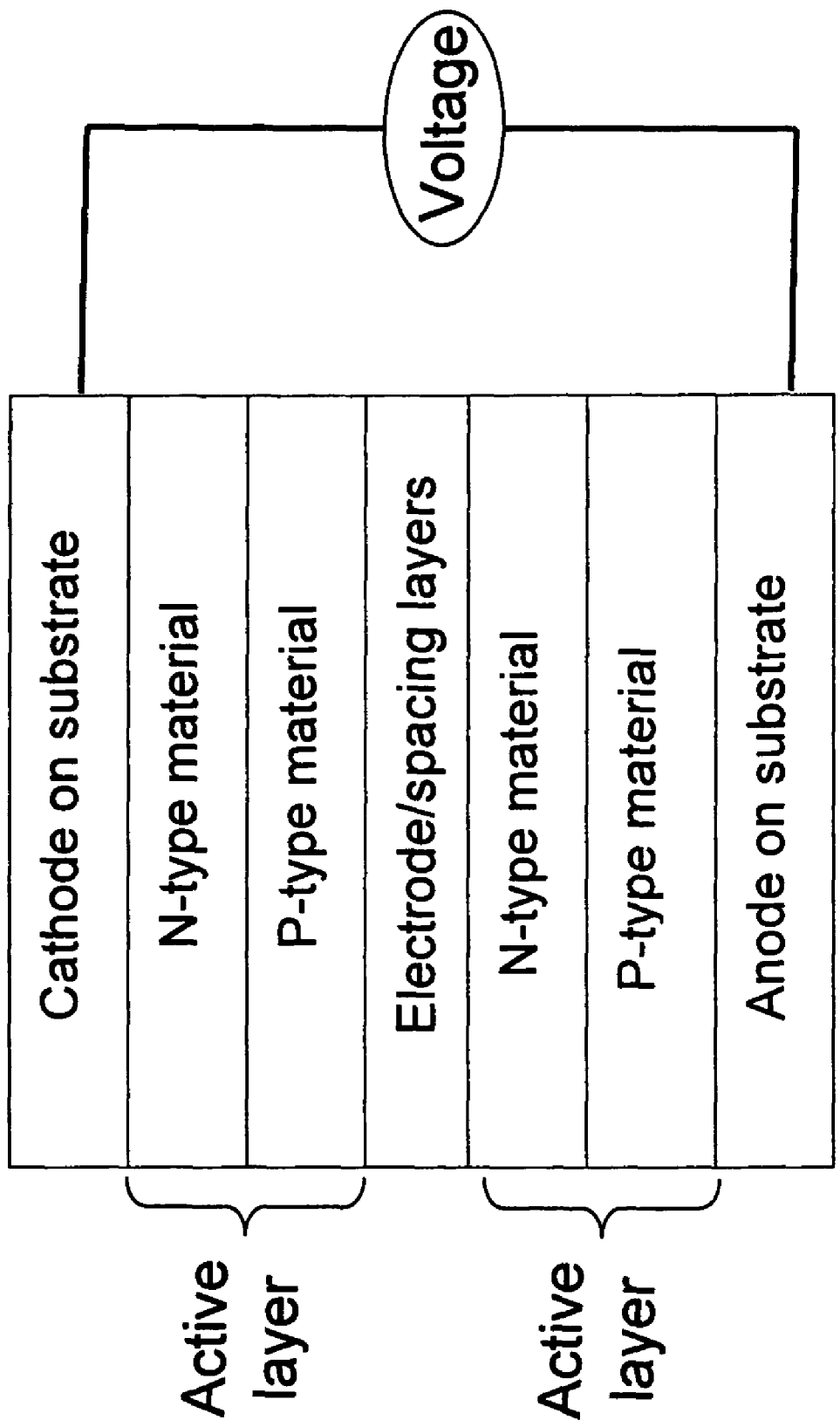
FIG. 8 illustrates another embodiment comprising multiple active layers and electrode or spacing layers.

A second embodiment of this invention is a modified photovoltaic device that incorporates multiple active layers which are combinations of p-type material comprised of a regio-regular poly(3-substitutedthiophene) in which the 3-substitutent is an alkyl, aryl, or alkyl/aryl moiety with an oxygen substitution in either the α- or β-position of the 3-substituent or a hetero atom (such as "S," with appropriate substitution to complete valence requirements) in either the α- or β-position of the 3-substituent as well as copolymers of these materials and n-type materials such as the following: fullerene based materials, metal oxide nanoparticles (such as $TiO_2$, ZnO, etc.), coated metal oxide nanoparticles (such as $TiO_2$, ZnO, etc.), carbon nanotubes, CdSe materials and other similarly functioning type of material, and n-doped silicon or germanium wherein these layers are adjacent or separated by a discrete integral component such as a spacer layer or electrode. FIG. 8 provides an illustration of this embodiment.

Figure 9:
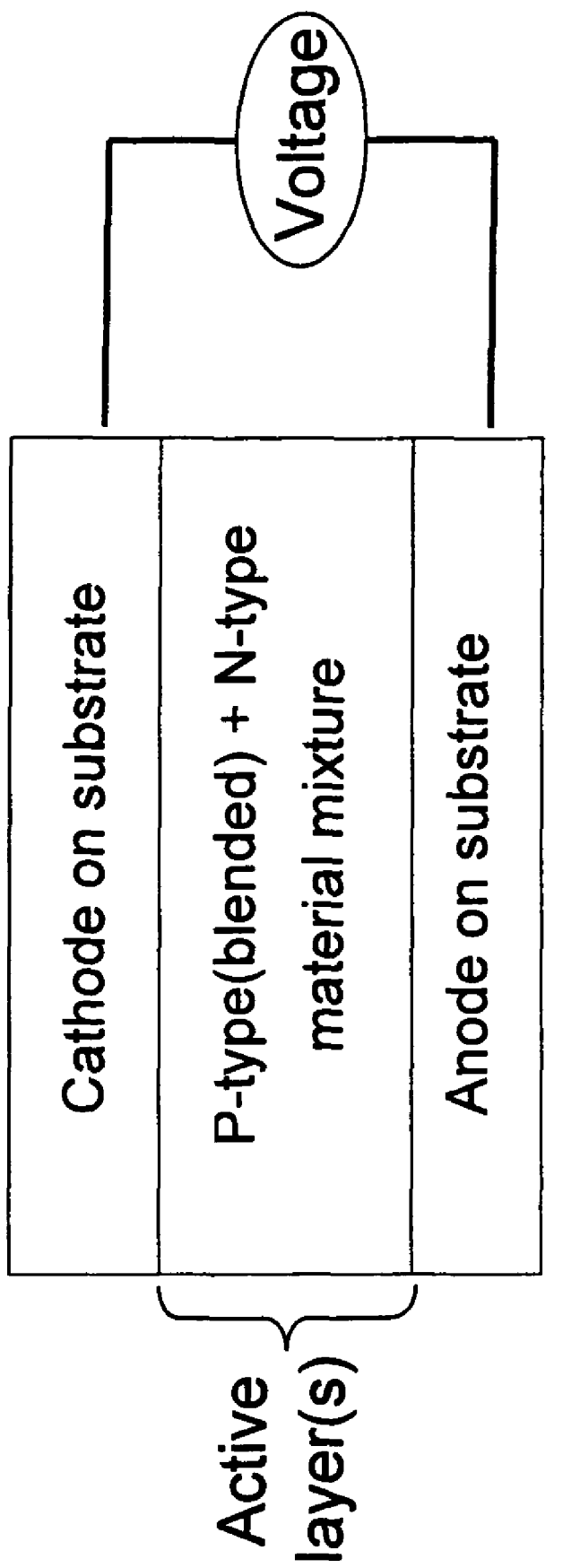
FIG. 9 illustrates another embodiment wherein the p-type and n-type materials are blended.

A third embodiment of this invention is a modified photovoltaic device that incorporates single or multiple active layers which are combinations of p-type material and n-type materials such as the following: fullerene based materials, metal oxide nanoparticles (such as $TiO_2$, ZnO, etc.), coated metal oxide nanoparticles (such as $TiO_2$, ZnO, etc.), carbon nanotubes, CdSe materials and other similarly functioning type of material, and n-doped silicon or germanium wherein these layers are adjacent or separated by a discrete integral component such as a spacer layer or electrode and wherein the p-type material is comprised of a regio-regular poly(3-substituted thiophene) in which the 3-substitutent is an alkyl, aryl, or alkyl/aryl moiety with an oxygen substitution in either the α- or β-position of the 3-substituent or a hetero atom (such as "S," with appropriate substitution to complete valence requirements) in either the α- or β-position of the 3-substituent as well as copolymers of these materials in a blend or mixture with a poly(thiophene) or a poly(3-alkylthiophene) or a poly(3-arylthiophene) or poly(3-alkyl/arylthiophene) or a regio-regular poly(3-alkylthiophene) or a regio-regular poly (3-arylthiophene) or a regio-regular poly(3-alkyl/arylthiophene). FIG. 9 provides an illustration of this embodiment.

A fourth embodiment of this invention is modified photovoltaic device that incorporates single or multiple active layers which are combinations of p-type material and n-type materials such as the following: fullerene based materials, metal oxide nanoparticles (such as $TiO_2$, ZnO, etc.), coated metal oxide nanoparticles (such as $TiO_2$, ZnO, etc.), carbon nanotubes, CdSe materials and other similarly functioning type of material, and n-doped silicon or germanium wherein these layers are adjacent or separated by a discrete integral component such as a spacer layer or electrode and wherein the p-type material is comprised of a regio-regular poly(3-substitutedthiophene) in which the 3-substitutent is an alkyl, aryl, or alkyl/aryl moiety with an oxygen substitution in either the α- or β-position of the 3-substituent or a hetero atom (such as "S," with appropriate substitution to complete valence requirements) in either the α- or β-position of the 3-substituent as well as copolymers of these materials in a mixture or blend with other inherently conductive polymers such as polypyrrole, poly(phenylenevinylene), PEDOT, and polyaniline. FIG. 9 provides an illustration of this embodiment.

A fifth embodiment of this invention is a modified photovoltaic device that incorporates single or multiple active layers which are combinations of p-type materials and n-type materials such as the following: fullerene based materials, metal oxide nanoparticles (such as $TiO_2$, ZnO, etc.), coated metal oxide nanoparticles (such as $TiO_2$, ZnO, etc.), carbon nanotubes, CdSe materials and other similarly functioning type of material, and n-doped silicon or germanium wherein these layer are adjacent or separated by a discrete integral component such as a spacer layer or electrode and wherein the p-type material is comprised of a regio-regular poly(3-substitutedthiophene) in which the 3-substitutent is an alkyl, aryl, or alkyl/aryl moiety with an oxygen substitution in either the α- or β-position of the 3-substituent or a hetero atom (such as "S," with appropriate substitution to complete valence requirements) in either the α- or β-position of the 3-substituent as well as copolymers of these materials in a blend or mixture with other low MW p-type material such as α-sexithiophene. FIG. 9 provides an illustration of this embodiment.

In a sixth embodiment, the 4 position of the thiophene ring can also be substituted. The substitution at the 4 position can provide the same substituent as that at the 3 position, providing a symmetrical substitution pattern. Or the 3 and 4 substitution can provide different substituents and an asymmetrical substitution pattern. Examples of groups which can be used as a substituent at the 4 position include alkyl, aryl, and alkylaryl groups including methyl, ethyl, propyl, butyl, and the like. Other examples include any of the substituents described herein for the 3 position, including those with heteroatoms.

In this invention good performance of a photovoltaic device containing a p-type material comprised of a regio-regular poly(3-substitutedthiophene) in which the 3-substitutent is an alkyl, aryl, or alkyl/aryl moiety with an oxygen substitution in either the α- or β-position of the 3-substituent or a hetero atom (such as "S," with appropriate substitution to complete valence requirements) in either the α- or β-position of the 3-substituent as well as copolymers is achieved if the p-type material is in a neutral or non-oxidized state and the contamination of the p-type material with metallic impurities is below about 1,000 ppm, or more particularly, is below about 500 ppm, or more particularly, below about 150 ppm. Metal impurity levels can be measured by known methods in the art including, for example, atomic absorption spectroscopy or photoinduced x-ray emission.

In addition, the following preferred embodiments can be practiced by one skilled in the art:

1) The use of a regio-regular poly(3-substitutedthiophene) in which the 3-substitutent is an alkyl, aryl, or alkyl/aryl moiety with an oxygen substitution in the α-position of the 3-substituent as a p-type semiconductor component of a photovoltaic device.

2) The use of a regio-regular poly(3-substitutedthiophene) in which the 3-substitutent is an alkyl, aryl, or alkyl/aryl moiety with an oxygen substitution in the β-position of the 3-substituent as a p-type semiconductor component of a photovoltaic device.

3) The use of a regio-regular poly(3-substitutedthiophene) in which the 3-substitutent is an alkyl, aryl, or alkyl/aryl moiety with a hetero atom in either the α- or β-position of the 3-substituent as a p-type semiconductor component of a photovoltaic device.

4) Preferred Embodiment #3 in which the heteroatom is "S"

5) Embodiment #3 in which the heteroatom is O.

6) Embodiment #3 in which the heteroatom is O or S.

7) Embodiments #1-6 such that the regio-regular poly(3-substitutedthiophene) is a copolymer.

8) Embodiment #7 such that the copolymer is a block copolymer including a segmented block copolymer. The copolymer can have non-thiophene units or a non-thiophene block.

9) Embodiment #7 such that the copolymer is an alternating copolymer. The copolymer can have non-thiophene units.

10) Embodiment #7 such that the alternating copolymer is a random copolymer. The copolymer can have non-thiophene units.

11) Embodiments #8-10 such that the copolymer has a non-thiophene block and the non-thiophene block is built from $CH_2CH$ Ar, where Ar=any aryl or functionalized aryl group.

12) Embodiments #8-10 such that the non-thiophene units are derived from an isocyanates 13) Embodiments #8-10 such that the non-thiophene units are derived from an ethylene oxides.

14) Embodiments #8-10 such that the non-thiophene units are derived from a conjugated diene 15) Embodiments #8-10 such that the non-thiophene units are derived from a lactone 16) Embodiments #8-10 such that the non-thiophene units are derived from a lactam 17) Embodiments #8-10 such that the non-thiophene units are derived from a siloxane 18) Embodiments #8-10 such that the non-thiophene units are derived from $CH_2CH_2R$ where R=Cl, 19) Embodiments #8-10 such that the non-thiophene units are derived from $CH_2CH_2R$ where R=OH 20) Embodiments #8-10 such that the non-thiophene units are derived from $CH_2CH_2R$ where R=H 21) Embodiments #8-10 such that the non-thiophene units are derived from $CH_2CH_2R$ where $R=CH_3$ 22) Embodiments #8-10 such that the non-thiophene units are derived from $CH_2CH_2R$ where R=an alkyl group 23) Embodiments #8-10 such that the non-thiophene units are derived from $CH_2CH_2R$ where R=F 24) Embodiments #8-10 such that the non-thiophene units are derived from $CH_2CH_2R$ where R=Br 25) Embodiments #8-10 such that the non-thiophene units are derived from an ATRP macroinitiator 26) Embodiments #8-10 such that the non-poly(3-substitutedthiophene) units are derived from one or more thiophene units.

27) Embodiments #8-10 such that the non-poly(3-substitutedthiophene) units are derived from one or more functionalized thiophene units.

28) Embodiments #8-10 such that the non-regio-regular poly(3-substitutedthiophene) units are derived from one or more functionalized oligothiophenes which is also random or well defined.

29) Embodiments #8-10 such that the non-regio-regular poly(3-substitutedthiophene) units are derived from one or more functionalized oligothiophenes which is also well defined.

30) Embodiments #8-10 such that the non-regio-regular poly(3-substitutedthiophene) units are derived from one or more functionalized oligothiophenes which are randomly defined.

31) Embodiments #1-30 such that the active layer is a combination of p- and n-type semiconductors 32) Embodiments #1-30 such that the active layer is two distinct, adjacent, and separate layers of p- and n-type materials.

33) Embodiments #1-30 such that the active layer is a single mixed layer of p- and n-type materials 34) Embodiments #1-30 such that the active layer is a mixed but phase-separated layer of p- and n-type materials 35) Embodiments #1-30 such that the active layer is a combination in which one or both materials are organized into a discrete structural unit or array 36) Embodiments #1-30 such that the active layer is a combination in which one or both materials are bound to a non-active organizing matrix such as a polymer or supramolecular scaffold 37) Embodiments #1-30 such that the active layer is manufactured by spin casting.
38) Embodiments #1-30 such that the active layer is manufactured by drop casting
39) Embodiments #1-30 such that the active layer is manufactured by vapor deposition or sputtering
40) Embodiments #1-30 such that the active layer is manufactured by dip coating,
41) Embodiments #1-30 such that the active layer is manufactured by printing techniques
42) Embodiment #41 such that the printing technique is ink-jetting
43) Embodiment #41 such that the printing technique is off-setting
44) Embodiment #41 such that the printing technique is a transfer process
45) Embodiments #1-30 such that the active layer is manufactured by spray applications.
46) Embodiments #1-45 such that the n-type material, which is responsible for conduction of electrons out of the active layer, is a fullerene or modified fullerene based material such as the methanofullerene PCBM
47) Embodiments #1-45 such that the n-type material are metal oxide nanoparticles
48) Embodiment #47 such that the metal oxide nanoparticles are comprised of $TiO_2$,
49) Embodiment #47 such that the metal oxide nanoparticles are comprised of ZnO,
50) Embodiments #47-49 such that the metal oxide nanoparticles are coated with the p-type material.
51) Embodiments #1-45 such that the n-type material is comprised of carbon nanotubes
52) Embodiments #1-45 such that the n-type material is comprised of CdSe materials and other similarly functioning electron affinity materials
53) Embodiments #1-45 such that the n-type material is comprised of CdSe
54) Embodiments #1-45 such that the n-type material is comprised of n-doped silicon or germanium.
55) Embodiments #1-54 wherein the active layers are adjacent
56) Embodiments #1-54 wherein the active layers are separated by a discrete integral component such as a spacer layer or electrode.
57) Embodiments #1-54 wherein the active layers are separated by a discrete non-active integral component such as a spacer layer or electrode.
58) Embodiments #1-55 wherein there is a single active layer
59) Embodiments #1-57 wherein there are multiple active layers
60) Embodiments #1-59 wherein the p-type material is a blend or mixture of materials comprising a regio-regular poly(3-substitutedthiophene) in which the 3-substitutent is an alkyl, aryl, or alkyl/aryl moiety with an oxygen substitution in either the α- or β-position of the 3-substituent or a hetero atom in either the α- or β-position of the 3-substituent, as well as copolymers of these materials and another conducting polymer derivative
61) Embodiment #60 in which the other conducting polymer derivative is poly(thiophene)
62) Embodiment #60 in which the conducting polymer derivative is a poly(3-alkylthiophene)
63) Embodiment #60 in which the conducting polymer derivative is a poly(3-arylthiophene)
64) Embodiment #60 in which the conducting polymer derivative is a poly(3-alkyl/arylthiophene)
65) Embodiment #60 in which the conducting polymer derivative is a regio-regular poly(3-alkylthiophene)
66) Embodiment #60 in which the conducting polymer derivative is a regio-regular poly(3-arylthiophene)
67) Embodiment #60 in which the conducting polymer derivative is a regio-regular poly(3-alkyl/arylthiophene).
68) Embodiment #60 in which the conducting polymer derivative is a regio-regular poly(3-thienylenvinylene).
69) Embodiment #60 in which the conducting polymer derivative is a regio-random poly(3- thienylenvinylene).
70) Embodiment #60 in which the conducting polymer derivative is a poly(pyrrole)
71) Embodiment #60 in which the conducting polymer derivative is a poly(phenylenevinylene)
72) Embodiment #60 in which the conducting polymer derivative is a PEDOT derivative
73) Embodiment #60 in which the conducting polymer derivative is a poly(aniline)
74) Embodiments #1-59 wherein the p-type material is comprised of a regio-regular poly(3-substitutedthiophene) in which the 3-substitutent is an alkyl, aryl, or alkyl/aryl moiety with an oxygen substitution in either the α- or β-position of the 3-substituent or a hetero atom in either the α- or β-position of the 3-substituent as well as copolymers of these materials in a blend or mixture with a low molecular weight p-type material. Low molecular weight can be, for example, about 2,000 or less, or more particularly, about 1,000 or less, wherein molecular weight is number average molecular weight.
75) Embodiment #74 in which the low molecular weight p-type material is α-sexithiophene
76) Embodiment #74 in which the low molecular weight p-type materials is a thiophene oligomer.
77) Embodiments #1-76 in which the p-type material is in a neutral or non-oxidized state.
78) Embodiments #1-77 in which the contamination of the p-type material with metallic impurities and other impurities is sufficiently low to allow for photovoltaic applications including less than, for example, about 1,000 ppm, or more particularly, less than about 500 ppm.
79) Embodiments #1-78 in which the regio-regular poly(3-substitutedthiophene) contains fluorine substituted alkyl and aryl functionality including perfluorinated alkyl and aryl groups.

In addition, the 70 claims of provisional application Ser. No. 60/612,641 can be practiced by one skilled in the art (e.g., "Provisional 1" below is provisional claim 1):

Provisional 1. A photovoltaic device comprising:
    a first electrode,
    a second electrode,
    an active layer disposed between the first and second electrodes, wherein the active layer comprises at least one p-type component and at least one n-type component, wherein the p-type component comprises at least one polymer comprising regio-regular poly(3-substitutedthiophene) in which the 3-substituent is an alkyl, aryl, or alkyl/aryl moiety with a heteroatom substitution in either the α- or β-position of the 3-substituent.
Provisional 2. The photovoltaic device according to 1, wherein the heteroatom is an oxygen or sulfur atom.
Provisional 3. The photovoltaic device according to 1, wherein the heteroatom is an oxygen atom.
Provisional 4. The photovoltaic device according to 1, wherein the heteroatom is a sulfur atom.
Provisional 5. The photovoltaic device according to 1, wherein the heteroatom substitution is in the α-position of the 3-substituent.

Provisional 6. The photovoltaic device according to 1, wherein the heteroatom substitution is in the α-position of the 3-substituent.

Provisional 7. The photovoltaic device according to 1, wherein the heteroatom substitution is an oxygen atom in the α-position of the 3-substituent.

Provisional 8. The photovoltaic device according to 1, wherein the heteroatom substitution is a sulfur atom in the β-position of the 3-substituent.

Provisional 9. The photovoltaic device according to 1, wherein the regio-regular poly(3-substitutedthiophene) is a homopolymer.

Provisional 10. The photovoltaic device according to 1, wherein the polymer is a homopolymer.

Provisional 11. The photovoltaic device according to 1, wherein the polymer is a copolymer.

Provisional 12. The photovoltaic device according to 1, wherein the polymer is a block copolymer.

Provisional 13. The photovoltaic device according to 1, wherein the polymer is an ABA block copolymer.

Provisional 14. The photovoltaic device according to 1, wherein the polymer is an AB block copolymer.

Provisional 15. The photovoltaic device according to 1, wherein the polymer is an alternating copolymer.

Provisional 16. The photovoltaic device according to 1, wherein the polymer is a random copolymer.

Provisional 17. The photovoltaic device according to 1, wherein the polymer is a copolymer comprising non-thiophene units.

Provisional 18. The photovoltaic device according to 1, wherein the polymer is a block copolymer comprising non-thiophene units.

Provisional 19. The photovoltaic device according to 1, wherein the n-type component and the p-type component are covalently bonded to each other.

Provisional 20. The photovoltaic device according to 1, wherein the n-type component and the p-type component are bonded to each other via coordinate bonding.

Provisional 21. The photovoltaic device according to 1, wherein the polymer comprises non-thiophene units.

Provisional 22. The photovoltaic device according to 21, wherein the non-thiophene units comprise aryl or functionalized aryl groups.

Provisional 23. The photovoltaic device according to 21, wherein the non-thiophene units comprise urethane or urea linkages.

Provisional 24. The photovoltaic device according to 21, wherein the non-thiophene units comprise alkylene oxide units.

Provisional 25. The photovoltaic device according to 21, wherein the non-thiophene units comprise ethylenically unsaturated units.

Provisional 26. The photovoltaic device according to 21, wherein the non-thiophene units comprise units derived from a lactone or lactam.

Provisional 27. The photovoltaic device according to 21, wherein the non-thiophene units comprise siloxane units.

Provisional 28. The photovoltaic device according to 21, wherein the non-thiophene units are derived from $CH_2CH_2R$, wherein R is Cl, OH, H, $CH_3$, alkyl, F, or Br.

Provisional 29. The photovoltaic device according to 21, wherein the non-thiophene units are derived from an ATRP macroinitiator.

Provisional 30. The photovoltaic device according to 1, wherein the polymer is a copolymer which comprises at least two different thiophene units in the polymer chain.

Provisional 31. The photovoltaic device according to 1, wherein the polymer is a copolymer which comprises at least two different functionalized thiophene units in the polymer chain.

Provisional 32. The photovoltaic device according to 1, wherein the polymer comprises non-poly(3-substitutedthiophene) units derived from one or more thiophene units.

Provisional 33. The photovoltaic device according to 1, wherein the polymer comprises non-poly(3-substitutedthiophene) units derived from one or more functionalized thiophene units.

Provisional 34. The photovoltaic device according to 1, wherein the polymer comprises non-regio-regular poly(3-substitutedthiophene) units.

Provisional 35. The photovoltaic device according to 1, wherein the polymer comprises non-regio-regular poly(3-substitutedthiophene) units.

Provisional 36. The photovoltaic device according to 1, wherein the active layer comprises a combination of p-type and n-type semiconductors.

Provisional 37. The photovoltaic device according to 1, wherein the active layer comprises two distinct, adjacent, and separate layers of p- and n-type materials.

Provisional 38. The photovoltaic device according to 1, wherein the active layer comprises a single mixed layer of p- and n-type materials.

Provisional 39. The photovoltaic device according to 1, wherein the active layer comprises a mixed but phase-separated layer of p- and n-type materials.

Provisional 40. The photovoltaic device according to 1, wherein the active layer comprises a combination in which one or both materials are organized into a discrete structural unit or array.

Provisional 41. The photovoltaic device according to 1, wherein the active layer comprises a combination in which one or both materials are bound to a non-active organizing matrix such as a polymer or supramolecular scaffold.

Provisional 42. The photovoltaic device according to 1, wherein the active layer is manufactured by spin casting, drop casting, vapor deposition, sputtering, or dip coating.

Provisional 43. The photovoltaic device according to 1, wherein the active layer is manufactured by printing.

Provisional 44. The photovoltaic device according to 1, wherein the active layer is manufactured by printing, wherein the printing is an ink jet printing, an off-setting printing, or a transfer process.

Provisional 45. The photovoltaic device according to 1, wherein the active layer is manufactured by spray applications.

Provisional 46. The photovoltaic device according to 1, wherein the n-type material is a fullerene, or metal oxide nanoparticles.

Provisional 47. The photovoltaic device according to 1, wherein the n-type material is metal oxide nanoparticles comprising titanium dioxide or zinc oxide.

Provisional 48. The photovoltaic device according to 1, wherein the n-type material comprises coated metal oxide nanoparticles.

Provisional 49. The photovoltaic device according to 1, wherein the n-type material comprises carbon nanotubes.

Provisional 50. The photovoltaic device according to 1, wherein the n-type material comprises a group II-VI semiconductor.

Provisional 51. The photovoltaic device according to 1, wherein the n-type material comprises CdSe.

Provisional 52. The photovoltaic device according to 1, wherein the n-type material comprises n-doped silicon or germanium.

Provisional 53. The photovoltaic device according to 1, wherein the active layers are separated by a discrete integral spacer or electrode layer.

Provisional 54. The photovoltaic device according to 1, wherein the active layer is a single layer.

Provisional 55. The photovoltaic device according to 1, wherein the active layer comprises multiple active layers.

Provisional 56. The photovoltaic device according to 1, wherein the p-type component further comprises a second conductive polymer.

Provisional 57. The photovoltaic device according to 56, wherein the second conductive polymer is a poly(thiophene), wherein the poly(thiophene) comprises alkyl, aryl, or alkylaryl substituents.

Provisional 58. The photovoltaic device according to 56, wherein the second conductive polymer is a regio-regular poly(3-alkylthiophene), a regio-regular poly(3-alkyl/arylthiophene), or a regio-regular poly(3-arylthiophene).

Provisional 59. The photovoltaic device according to 56, wherein the second conductive polymer is a regio-regular poly(3-thienylenvinylene).

Provisional 60. The photovoltaic device according to 56, wherein the second conductive polymer is a region-random poly(3-thienylenvinylene).

Provisional 61. The photovoltaic device according to 56, wherein the second conductive polymer comprises a poly(pyrrole), a poly(phenylene vinylene), PEDOT or a PEDOT derivative, or a poly(aniline).

Provisional 62. The photovoltaic device according to 1, wherein the p-type material further comprises a p-type material having a number average molecular weight of about 1,000 or less.

Provisional 63. The photovoltaic device according to 1, wherein the p-type material further comprises a p-type material having a number average molecular weight of about 1,000 or less, wherein the material is a thiophene oligomer.

Provisional 64. The photovoltaic device according to 1, wherein the p-type material is in a neutral or non-oxidized state.

Provisional 65. The photovoltaic device according to 1, wherein the poly(3-substitutedthiophene) is further substituted at the 4 position.

Provisional 66. A photovoltaic device comprising:
a first electrode,
a second electrode,
an active layer disposed between the first and second electrodes, wherein the active layer comprises at least one p-type component and at least one n-type component, wherein the p-type component comprises at least one polymer comprising regio-regular poly(3-substitutedthiophene) in which the 3-substituent is an alkyl, aryl, or alkyl/aryl moiety with a heteroatom substitution in either the α- or β-position of the 3-substituent, wherein the heteroatom is an O or S atom, and wherein the polymer is a homopolymer or a copolymer.

Provisional 67. A photovoltaic device having low metal impurities in the p-type component comprising:
a first electrode,
a second electrode,
an active layer disposed between the first and second electrodes, wherein the active layer comprises at least one p-type component and at least one n-type component, wherein the p-type component consists essentially of at least one polymer consisting essentially of a regio-regular poly(3-substitutedthiophene) in which the 3-substituent is an alkyl, aryl, or alkyl/aryl moiety with a heteroatom substitution in either the α- or β-position of the 3-substituent, wherein the heteroatom is an O or S atom, and wherein the polymer is a homopolymer or a copolymer.

Provisional 68. A photovoltaic device comprising:
a first electrode,
a second electrode,
an active layer disposed between the first and second electrodes, wherein the active layer comprises at least one p-type component and at least one n-type component, wherein the p-type component comprises at least one homopolymer or copolymer comprising regio-regular poly(3-substitutedthiophene) in which the 3-substituent is an alkyl, aryl, or alkyl/aryl moiety with a heteroatom substitution in either the α- or β-position of the 3-substituent, wherein the active layer comprises multiple active layers.

Provisional 69. A photovoltaic device comprising:
a first electrode,
a second electrode,
an active layer disposed between the first and second electrodes, wherein the active layer comprises at least one p-type component and at least one n-type component, wherein the p-type component is part of a polymer blend comprising at least one homopolymer or copolymer comprising regio-regular poly(3-substitutedthiophene) in which the 3-substituent is an alkyl, aryl, or alkyl/aryl moiety with a heteroatom substitution in either the α- or β-position of the 3-substituent, wherein the active layer comprises multiple active layers.

Provisional 70. A photovoltaic device comprising:
a first electrode,
a second electrode,
an active layer disposed between the first and second electrodes, wherein the active layer comprises at least one p-type component and at least one n-type component, wherein the p-type component is part of a polymer blend comprising (i) at least one first electronically conductive polymer which is a homopolymer or copolymer comprising regio-regular poly(3-substitutedthiophene) in which the 3-substituent is an alkyl, aryl, or alkyl/aryl moiety with a heteroatom substitution in either the α- or β-position of the 3-substituent, and (ii) at least one second electronically conductive polymer different from the first.

Film Thickness

In a photovoltaic device, film thickness for the active layer is not particularly limited but can be, for example, about 25 nm to about 200 nm, or about 50 nm to about 150 nm. If two layer are used, such as in the working example below, the thickness of the two layers combined can be, for example, about 50 nm to about 250 nm, or about 100 nm to about 200 nm.

Performance of Photovoltaic Device

The polymers as described and claimed herein provide improved performance for open circuit voltage. For example, performance can be compared to an alkyl analog without the heteroatom substitution. An improvement of at least 5%, or at least 10%, or at least 15% can be observed. For example, improved in open circuit voltage can be observed of at least 5%, or at least 10%, or at least 15%. Also, improvement in short circuit current can be observed of at least 5%, or at least 10%, or at least 15%.

Heterojunction

In an important embodiment, the n-type material comprises a nanomaterial such as, for example, a fullerene or a fullerene-derivative. Fullerenes can be derivatized with organic groups e.g., PCBM. The processes for mixing can be controlled to provide the best degree of phase separation.

Working Examples

In addition, non-limiting working examples are also provided.

Preparation of Polymers

Novel copolymers of alkyl/alkoxy-functionalized polythiophenes for PV applications. See FIG. 10.

Experimental

Materials.

All reactions were conducted under prepurified nitrogen, using either flame-dried or oven-dried glassware. All glassware was assembled while hot and cooled under nitrogen. Ice/water, dry ice/acetone were used for 0° and −78° C. baths, respectively. Commercial chemicals, 3-bromothiophene, [1,3-bis(diphenylphosphino) propane]dichloronickel(II) (Ni(dppp)Cl$_2$), were purchased from Aldrich Chemical Co., Inc. and used without further purification. N-Bromosuccinimide (NBS) was recrystallized from water. Prior to use, tetrahydrofuran (THF) was dried over and distilled from sodium benzophenone ketyl.

Measurements.

$^1$H and $^{13}$C NMR spectra were recorded on a Bruker Avance AV-300 (operating at 300.13 MHz in $^1$H and 75.47 MHz in $^{13}$C) and Bruker Avance DMX-500 (operating at 500.13 MHz in $^1$H and 125.76 in $^{13}$C) spectrometers. All NMR spectra were recorded in deuterated chloroform (CDCl$_3$) as solvent containing 0.003% TMS as an internal reference unless noted otherwise. The amount of head-to-tail coupling was determined by NMR integration of the small peaks near 7.0 ppm using the Sato and Morii analysis and the peaks near 2.5 ppm using the method of Elsenbaumer et al. Elsenbaumer, R. L.; Jen, K.-Y.; Miller, G. G.; Eckhardt, H.; Shacklette, L. W.; Jowii, R. *Electronic Properties of Conjugated Polymers*; Kuzmany, H., Mehring, M., Roth, S., Eds.; Springer Series in Solid State Sciences 1987, 76, 400.

GC/MS was performed on a Hewlett-Packard Agilent 6890-5973 GC-MS workstation. The GC column was a Hewlett-Packard fused silica capillary column cross-linked with 5% phenylmethyl siloxane. Helium was the carrier gas (1 mL/min). Unless otherwise noted, the following conditions were used for all GC/MS analyses: Injector temperature, 250° C.; initial temperature, 70° C.; temperature ramp, 10° C./min; final temperature, 300° C.

Gel Permeation Chromatography (GPC) traces were recorded on a Waters 2690 Separations Module apparatus and a Waters 2487 Dual λ Absorbance Detector where chloroform was the eluent (flow rate 1.0 mL/min, 30° C., λ=254 nm and λ=350 nm) with a series of three Styragel columns (10$^5$, 10$^3$, 100 Å; Polymer Standard Services) and a guard column. Calibration based on polystyrene standards purchased from Polymer Standard Service was applied for determination of molecular weights and toluene was used as an internal standard.

All UV-Vis-NIR spectra were recorded on either polymer solutions in anhydrous chloroform, unless stated otherwise, or polymer thin films cast onto 22 mm square cover glass using a Perkin-Elmer Lambda 900 UV/Vis NIR spectrometer and are reported in terms of wavelength (nm). Optical spectroscopy was performed at ambient atmospheric conditions.

General procedure for preparation of random copolymers of alkyl/alkoxy functionalized polythiophenes by the Grignard Metathesis (GRIM) method.

In a typical polymerization experiment, a dry 50-mL three-neck round bottom flask was flushed with N$_2$ and charged with 2,5-dibromo-3-(2,5,8-trioxanonyl)thiophene (0.486 g, 1.3 mmol) and anhydrous THF (13 mL) via syringe. A 2M solution of an alkyl magnesium halide (0.65 mL, 1.3 mmol) in diethyl ether (Et$_2$O) was added via a deoxygenated syringe, and the reaction mixture was stirred for 1 hour at ambient temperature. The magnesium-bromine exchange reaction was monitored by the GC-MS analysis. Another dry 250-mL three-neck round bottom flask was flashed with N$_2$ and charged with 2,5-dibromo-3-hexylthiophene (2.51 g, 7.7 mmol), dodecane (3 to 5 drops) (internal standard), and anhydrous THF (75 mL) via syringe. A 2M solution of an alkyl magnesium halide (3.85 mL, 7.7 mmol) (in Et$_2$O) was added via a deoxygenated syringe. The reaction mixture was stirred for 1 hour at ambient temperature. Subsequently, the content of the 50-mL three-neck round bottom flask was introduced to the 250-mL via a deoxygenated syringe, at which point an aliquot (0.5 mL) was taken out, quenched with water, and subjected to a GC-MS analysis. This was followed by the addition of Ni(dppp)Cl$_2$ (0.024 g, 0.44 mmol) as a suspension in 2 mL of anhydrous THF. Aliquots (1 mL) were taken at different time intervals and each was precipitated in methanol (5 mL). For each aliquot, a sample was prepared in Et$_2$O (2 mL) and subjected to GC-MS analysis. The polymerization was allowed to proceed for 15 minutes at room temperature, and then was subjected to reflux. The polymer was precipitated after 16 hours by pouring it into acidic methanol/water mixture (500 mL), followed by sequential purification by Soxhlet extraction with methanol, hexanes, and chloroform (CHCl$_3$). The CHCl$_3$ fraction was kept.

Figure 10:
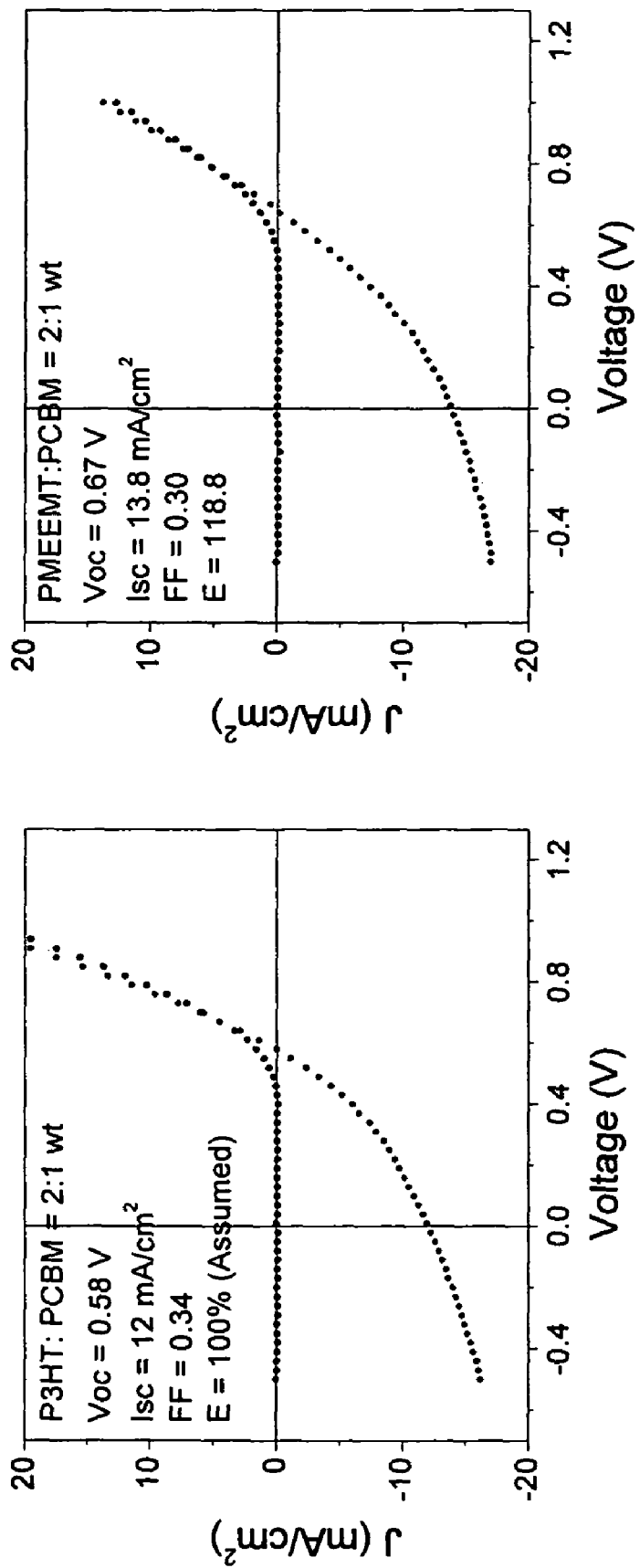
FIG. 10 illustrates cyclic voltammograms of P3HT-ran-PMEET/MEET on a glassy carbon working electrode for a solution cast ($CHCl_3$ 0.3% w/w) thin film in 0.1 M $Bu_4NPF_6$/$CH_3CN$ at 20 mV/s scan rate.

Tables 1 and 2 and FIG. 10 provide characterization data.

TABLE 1

Molecular weight and structural composition data of random copolymers of alkyl/alkoxy-functionalized polythiophenes. The value n refers to mole percent of the alkoxy-substituted monomer, the value m refers to mole percent of alkyl-substituted monomer. Polymerization conditions can be varied so that m can be, for example, about 5 to about 25 mole percent, or about 10 to about 20 mole percent, with the remaining being the alkoxy-substituted comonomer.

| Copolymer | GPC | | $^1$H NMR | |
|---|---|---|---|---|
| | $M_n$ | PDI | n (%) | m (%) |
| P3HT-r-PMEEMT | 42150 | 1.5 | 87 | 13 |
| P3HT-r-PMEET | 47540 | 1.5 | 90 | 10 |

TABLE 2

Optical and electrochemical data of random copolymers of alkyl/alkoxy-functionalized polythiophenes

| Copolymer | $\lambda_{max}$ (nm) | | | HOMO[3] |
|---|---|---|---|---|
| | Solid state[1] | Solution[2] | $E_g$ (eV) | (eV) |
| P3HT-r-PMEEMT | 537 | 448 | 1.9 | −5.09 |
| P3HT-r-PMEET | 558 | 461 | 1.9 | −5.04 |

[1]Films spin-cast from chloroform;
[2]Choroform solvent;
[3]HOMO values calculated by onset of oxidation using cyclic voltametery (typical values for P3HT are 4.8-5.1 eV)

Preparation of Device

The photovoltaic devices were prepared with patterned indium tin oxide (ITO, anode) glass substrate; a 50 nm thin layer of poly(3,4-ethylenedioxythiophene) doped with polystyrene sulfonic acid (PEDOT:PSSA, Baytron P VP Al 4083 grade, HC Stark); a 100 nm thin layer of the regioregular polymer of the working example described above mixed with methanofullerence [6,6]-phenyl C61-butyric acid methyl ester (PCBM) to form a blend; and LiF/Al bilayer cathode. The patterned ITO glass substrates were cleaned with hot water and organic solvents (acetone and alcohol) in an ultrasonic bath and treated with ozone plasma before the PEDOT:PSS water solution was spin coated on the top. The film was dried at 170° C. for 10 mins in air as recommended by Bayer. The thickness of PEDOT:PSS film was controlled at about 50 nm. Tapping mode atomic force microscopy (TMAFM, Veeco Multi-mode) height image shows that PEDOT:PSS layer can planarize the ITO anode. The roughness of PEDOT:PSSA surface is smaller than that of the ITO surface, preventing local shorting currents and improving device reproducibility.

The 2:1 weight ratio (P3HT-ran-PMEET: PCBM blend was next spin-coated on top of the PEDOT:PSSA film from chloroform solution with no damage to PEDOT:PSSA film to give an 100 nm thick film, verified by AFM. Then the film was annealed at 100° C. for 2.5 mins in glove box. TMAFM height and phase images indicated this blend can microphase separate into bicontinuous bulk heterojunction. Next, the 1 nm LiF layer was thermally evaporated onto the active layer through a shadow mask, followed by deposition of a 200 nm Al layer. Then a drop of epoxy was put on the top of devices with a glass slide covering it. The encapsulation was completed by shining UV light on the devices for 30 minutes. Finally, the devices were tested in air.

The photovoltaic characteristics of devices under white light exposure (Air Mass 1.5 Global Filter) were measured using a system equipped with a Keithley 2400 source meter and Oriel 300 W Solar Simulator based on Xe lamp with output intensity of about 80 mW/cm$^2$.

Figure 11:
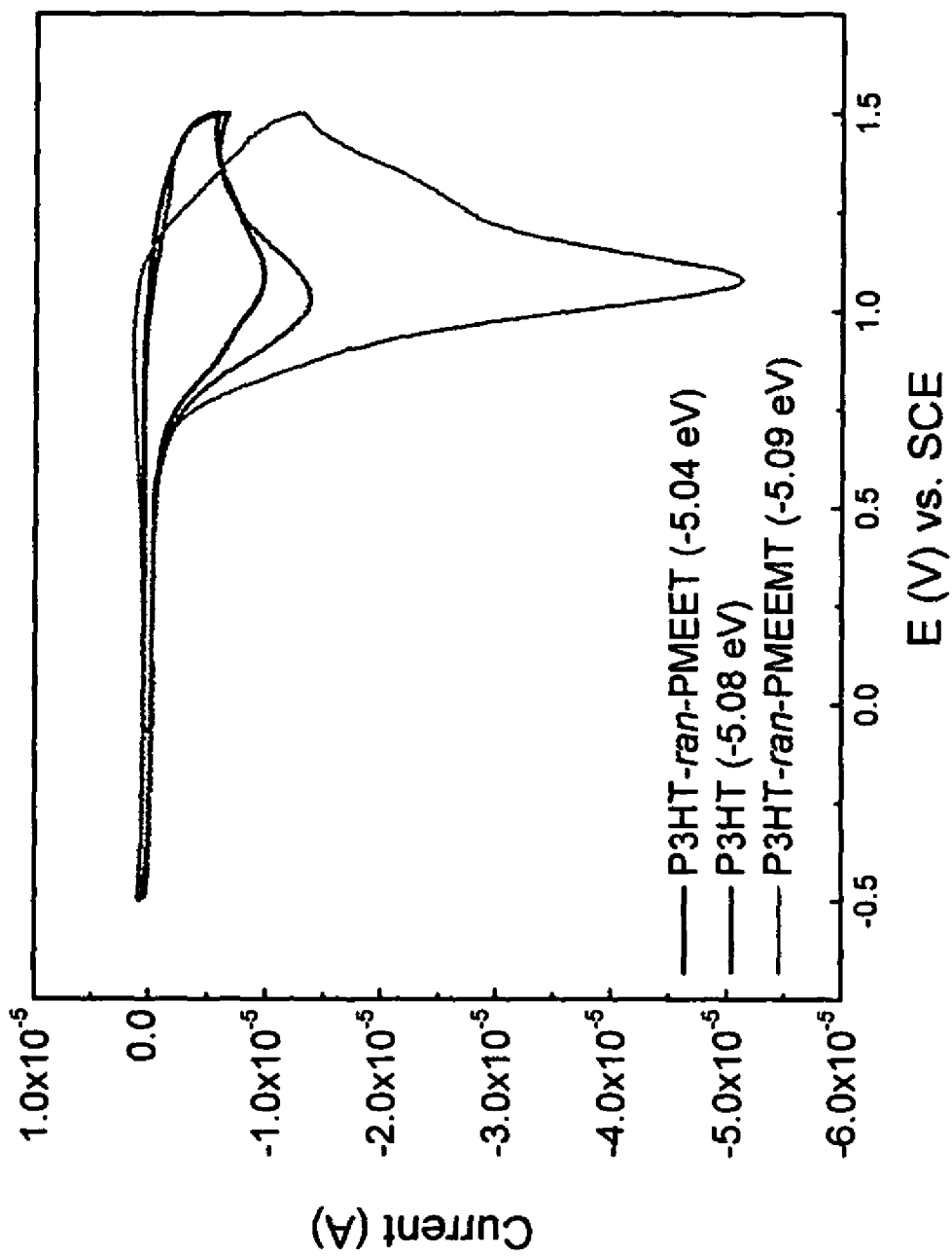
FIG. 11 illustrates current density vs voltage (J-V) characteristics of two polymer photovoltaic cells with structure ITO/PEDOT:PSSA/active layer/LiF/Al. Active layer is made with bulk heterojunction of two p-type semiconducting polymer and PCBM.

Under same preparation and testing conditions, the copolymers of the working example showed 12% higher open circuit voltage ($V_{OC}$), 15% higher short circuit current ($I_{SC}$), consequently 18% higher efficiency than that of regioregular poly (3-hexylthiophene) as shown in FIG. 11. The P3HT/PCBM system was assumed to provide a 100% efficiency for comparison purposes.

The electronic and optical properties of solid state film of p-/n-type blend correlated with the quality of the films, depending on the casting, e.g., solvents, spin speed, and environments, as well as post treatment conditions (e.g., annealing temperature and time). Also, the transport of electrons and holes in bulk to electrodes is related to the ratio of n-type and p-type materials. So the performance of these polymer photovoltaic cells can be improved by optimizing these parameters.

What is claimed is:

1. A photovoltaic device comprising:
    a first electrode,
    a second electrode,
    an active layer disposed between the first and second electrodes, wherein the active layer comprises at least one p-type component and at least one n-type component, wherein the p-type component comprises at least one copolymer comprising regio-regular poly(3-substitutedthiophene) in which the 3-substituent is an alkyl moiety with an oxygen heteroatom substitution in the α-position of the 3-substituent.

2. The device according to claim 1, wherein the copolymer further comprises a comonomer comprising an alkyl 3-substituent.

3. The device according to claim 1, wherein the copolymer further comprises a comonomer comprising an alkyl 3-substituent present in about 5 to about 25 mole percent.

4. The device according to claim 1, wherein the active layer further comprises a different polythiophene.

5. The device according to claim 1, wherein the weight ratio of p-type to n-type material is about 1:1 to about 3:1, and the active layer comprises a polymer-fullerene heterojunction.

6. The device according to claim 1, wherein the weight ratio of p-type to n-type material is about 1.5:1 to about 2.5:1.

* * * * *